(12) United States Patent
Li et al.

(10) Patent No.: US 9,697,894 B2
(45) Date of Patent: Jul. 4, 2017

(54) METHODS AND CIRCUIT ARRANGEMENTS FOR DETERMINING RESISTANCES

(71) Applicant: Agency for Science, Technology and Research, Singapore (SG)

(72) Inventors: Fei Li, Singapore (SG); Kit Ho Melvin Chow, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 477 days.

(21) Appl. No.: 14/225,367

(22) Filed: Mar. 25, 2014

(65) Prior Publication Data

US 2014/0285226 A1 Sep. 25, 2014

(30) Foreign Application Priority Data

Mar. 25, 2013 (SG) .................................. 201302162

(51) Int. Cl.
*G01R 27/02* (2006.01)
*G11C 13/00* (2006.01)
(Continued)

(52) U.S. Cl.
CPC ........ *G11C 13/004* (2013.01); *G11C 11/1673* (2013.01); *G11C 13/0002* (2013.01);
(Continued)

(58) Field of Classification Search
CPC .. G01R 27/02; G11C 13/0002; G11C 13/004; G11C 11/1673; G11C 29/24; G11C 29/50008; G11C 2013/005
(Continued)

(56) References Cited

U.S. PATENT DOCUMENTS 6,055,178 A * 4/2000 Naji ........................ G11C 11/16
365/158
7,929,334 B2 4/2011 Rao et al.
(Continued)

OTHER PUBLICATIONS

Yu (Kevin) Cao, et al., "Predictive Technology Model (PTM)", Nanoscale Integration and Modeling (NIMO) Group, Arizona State University, retrieved from the Internet: http://ptm.asu.edu/, 8 pages, (Jun. 1, 2012).

*Primary Examiner* — Melissa Koval
*Assistant Examiner* — Courtney McDonnough
(74) *Attorney, Agent, or Firm* — Blakely, Sokoloff, Taylor & Zafman LLP

(57) ABSTRACT

A method may include applying a first current through the memory element and a first selection component. The memory element and the first selection component may be located along a memory line. The method may also include measuring a first potential difference across the memory line. The method may further include applying a second current through a second selection component, wherein the second selection component is located along a dummy line, and measuring a second potential difference across the dummy line. The method may additionally include determining the resistance of the memory element based on the first potential difference and the second potential difference. The first selection component may be activated and the second selection component may be deactivated to apply the first current. The first selection component may be deactivated and the second selection component may be activated to apply the second current.

18 Claims, 18 Drawing Sheets

(51) Int. Cl.
*G11C 11/16* (2006.01)
*G11C 29/24* (2006.01)
*G11C 29/50* (2006.01)

(52) U.S. Cl.
CPC ........ *G11C 29/24* (2013.01); *G11C 29/50008* (2013.01); *G11C 2013/0054* (2013.01)

(58) Field of Classification Search
USPC ........................................................ 324/705
See application file for complete search history.

(56) References Cited

U.S. PATENT DOCUMENTS

2002/0172073 A1* 11/2002 Hidaka .................. G11C 11/16
 365/158
2010/0188894 A1* 7/2010 Rao ........................ G11C 11/16
 365/171
2012/0195103 A1* 8/2012 Kajigaya ............. G11C 11/4091
 365/149

* cited by examiner

FIG. 2

- 200 applying a first current through the memory element and a first selection component
- 202
- 204 measuring a first potential difference across the memory line
- 206 applying a second current through a second selection component
- 208 measuring a second potential difference across the dummy line
- 210 determining the resistance of the memory element based on the first potential difference and the second potential difference

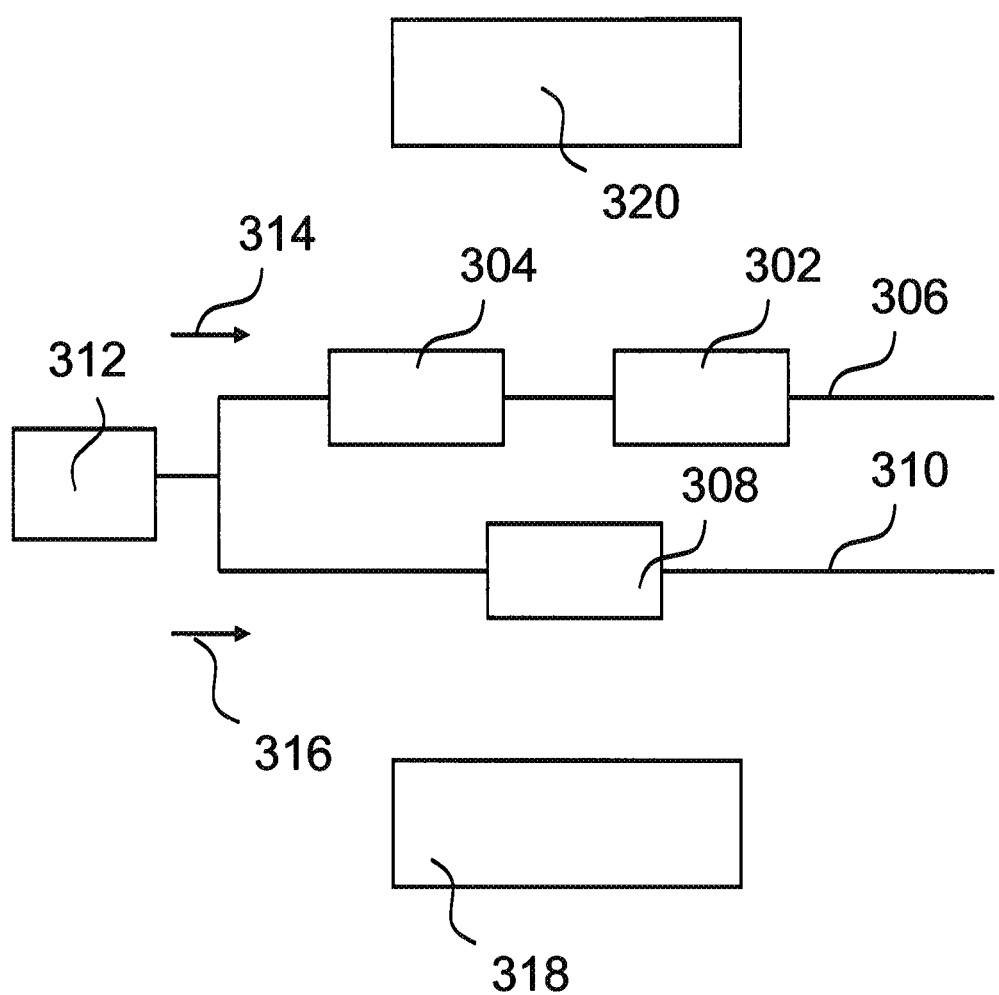

|  | Invention | Reference 1 |
|---|---|---|
| Standard Deviation | 19.3 ohms | 172.9 ohms |

| | Reference 1 (1702) | Invention (1704) |
|---|---|---|
| Accuracy | Medium (matured process) Low (advanced process) | Very High |
| Characterization Time | $t_{char}$ | $0.33\, t_{char}$ |
| Area Overhead[1] | 3.4% | 0.1% |
| Number of I/O[2] | 3 + n | n |

[1] To achieve the same accuracy at 32nm
[2] To achieve the same characterization time

METHODS AND CIRCUIT ARRANGEMENTS FOR DETERMINING RESISTANCES

CROSS-REFERENCE TO RELATED APPLICATIONS

This application claims the benefit of priority of SG application No. 201302162-1 filed Mar. 25, 2013, the contents of it being hereby incorporated by reference in its entirety for all purposes.

TECHNICAL FIELD

Various aspects of this disclosure relate to methods of and circuit arrangements for determining resistances of memory cells.

BACKGROUND

Memory devices can be classified as two broad categories, volatile memories such as static random-access memory (SRAM) as well as dynamic random-access memory (DRAM) and non-volatile memories (NVMs) such as Flash, resistive random-access memory (RRAM), magnetoresistance random-access memory (MRAM) as well as phase change random-access memory (PCRAM) etc. The volatile memories lose the data when the power is turned off. In contrast, the non-volatile memories retain the stored data even when the power is turned off.

MRAM is a new type of non-volatile memory that utilizes the magnetic polarization of the ferromagnetic materials of the magnetic tunneling junction (MTJ) instead of electrical charges to store information. The MTJ normally includes three layers, i.e. the reference layer which has a fixed magnetic polarization, the free layer which has a programmable magnetic polarization and the non-ferromagnetic tunneling layer in between of the reference layer and the free layer. If the magnetic polarization of the free layer is in the parallel direction as that of the reference layer, the MTJ has resistance RP and the MRAM device stores 1 bit data of '0'. If the magnetic polarization of the free layer is in the anti-parallel direction as that of the reference layer, the MTJ resistance is RAP (RAP>RP) and the MRAM device stores 1 bit data of '1'. The tunneling magnetoresistance (TMR) ratio, (RAP−RP)/RP, indicates the gap between the two resistance states of an MTJ.

In particular, spin-torque-transfer (STT) MRAM uses the flow of spin-polarized electrons that fulfills a critical current density to directly change the polarization of the free layer. The state of the MTJ depends on the direction of electron flow. Reading the state of the MTJ uses a current smaller than the critical current to avoid unnecessary write to the MTJ.

FIG. 1 is a schematic 100 illustrating the causes that contribute to the failure of NVM chips. The condition of the silicon NVM chip 102 may be attributable to complementary metal oxide semiconductor (CMOS) circuit performance 104 and the NVM device (i.e. memory element) performance 106. In the event of a faulty chip, it is very important to be able to find the root of the failure and optimize the design in future fabrication. While testing methods for CMOS circuits in a complex system have been well established, the characterization method for NVM devices (memory elements in NVM) remains relatively unexplored.

The series resistance along a data path of a NVM device may include the resistance of the memory element (e.g. the MTJ), the resistance of a selection component, resistances of other components such as column switches as well as parasitic resistances. These resistances of the selection component and other components as well as parasitic resistances may be comparable to the resistance of the memory element. As the CMOS technology scales, the large process variations hinder the accurate characterization of the resistance of the memory element in a NVM memory array. It is necessary to have a method that measures the resistances of the memory element of both states in a NVM memory array that has strong tolerance to CMOS process variation and parasitic effects in order to facilitate statistical analysis of the resistance distribution for improving the back-end-of-the-line (BEOL) NVM process.

SUMMARY

In various embodiments, a method of determining a resistance of a memory element may be provided. The method may include applying a first current through the memory element and a first selection component. The memory element and the first selection component may be located along a memory line. The method may also include measuring a first potential difference across the memory line. The method may further include applying a second current through a second selection component, wherein the second selection component is located along a dummy line, and measuring a second potential difference across the dummy line. The method may additionally include determining the resistance of the memory element based on the first potential difference and the second potential difference. The first selection component may be activated and the second selection component may be deactivated to apply the first current. The first selection component may be deactivated and the second selection component may be activated to apply the second current.

In various embodiments, a circuit arrangement for determining a resistance of a memory element may be provided. The circuit arrangement may include the memory element and a first selection component coupled to the memory element along a memory line. The circuit arrangement may also include a second selection component along a dummy line. The circuit arrangement may further include a current source configured to apply a first current to the memory element and the first selection component along the memory line. The current source may be further configured to apply a second current to the second selection component along the dummy line. The circuit arrangement may additionally include a voltage measurement circuit configured to measure a first potential difference across the memory line. The voltage measurement circuit may be further configured to measure a second potential difference across the dummy line. The first potential difference and the second potential difference may be measured for determining the resistance of the memory element. The circuit arrangement may also include a control circuit configured to activate the first selection component and deactivate the second selection component to apply the first current. The circuit arrangement may be further configured to deactivate the first selection component and activate the second selection component to apply the second current.

BRIEF DESCRIPTION OF THE DRAWINGS

The invention will be better understood with reference to the detailed description when considered in conjunction with the non-limiting examples and the accompanying drawings, in which:

FIG. 2 is a schematic illustrating a method of determining a resistance of a memory element according to various embodiments.

FIG. 3 shows a schematic of a circuit arrangement for determining a resistance of a memory element may be provided according to various embodiments.

FIG. 13B is a table comparing the standard deviations of the calculated resistance in the circuit arrangement according to various embodiments and the reference circuit.

FIG. 17 is a table comparing the figures of merit.

DETAILED DESCRIPTION

Figure 1:
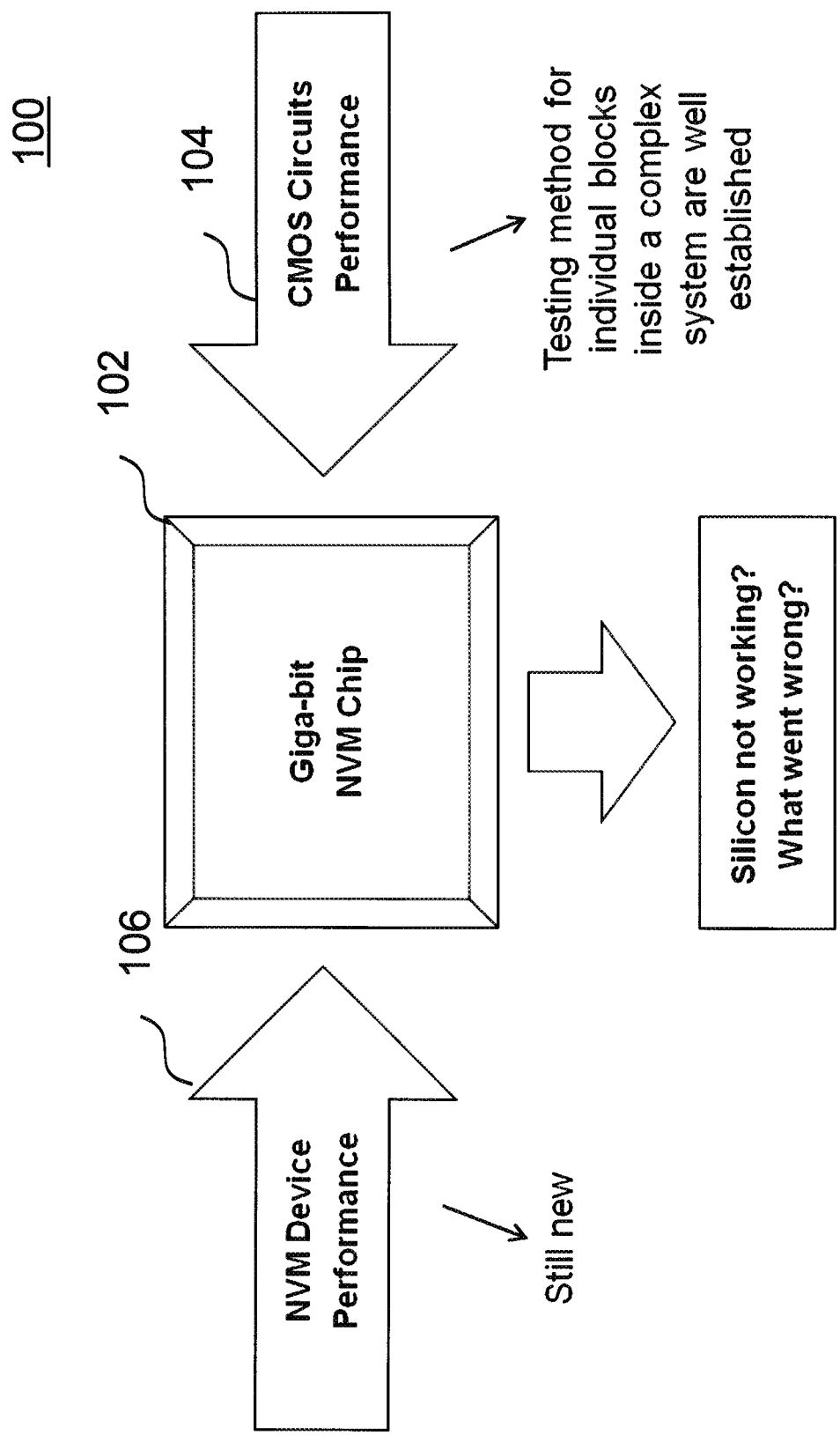
FIG. 1 is a schematic illustrating the causes that contribute to the failure of NVM chips.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

In order that the invention may be readily understood and put into practical effect, particular embodiments will now be described by way of examples and not limitations, and with reference to the figures.

It should be understood that the terms "bottom", "top", "left", "right", "corner" etc., when used in the following description are used for convenience and to aid understanding of relative positions or directions, and not intended to limit the orientation of any device or structures or any part of any device or structure.

In various embodiments, a "circuit" may be understood as any kind of a logic implementing entity, which may be special purpose circuitry or a processor executing software stored in a memory, firmware, or any combination thereof. Thus, in various embodiments, a "circuit" may be a hard-wired logic circuit or a programmable logic circuit such as a programmable processor, e.g. a microprocessor (e.g. a Complex Instruction Set Computer (CISC) processor or a Reduced Instruction Set Computer (RISC) processor). A "circuit" may also be a processor executing software, e.g. any kind of computer program, e.g. a computer program using a virtual machine code such as e.g. Java. Any other kind of implementation of the respective functions which will be described in more detail below may also be understood as a "circuit" in accordance with an alternative embodiment.

FIG. 2 is a schematic 200 illustrating a method of determining a resistance of a memory element according to various embodiments. The method may include, in 202, applying a first current through the memory element and a first selection component. The memory element and the first selection component may be located along a memory line. The method may also include, in 204, measuring a first potential difference across the memory line. The method may further include, in 206, applying a second current through a second selection component. The second selection component may be located along a dummy line. The method may further include, in 208, measuring a second potential difference across the dummy line. The method may additionally include, in 210, determining the resistance of the memory element based on the first potential difference and the second potential difference. The first selection component may be activated and the second selection component may be deactivated to apply the first current. The first selection component may be deactivated and the second selection component may be activated to apply the second current.

In other words, the method may include passing a first current along a memory line having a memory element and a first selection component. The method may include measuring a first potential difference across the memory element and the first selection component. The method may also include passing a second current along a dummy line having a second selection component. The method may further include measuring a second potential difference across the second selection component. The resistance of the memory element may be determined based on the first potential difference and the second potential difference. The first selection component may be switched on and the second selection component may be switched off in order to allow the first current to flow along the memory line while disallowing the second current to flow along the dummy line. The first selection component may be switched off and the second selection component may be switched on to disallow the first current to flow along the memory line while allowing the second current to flow along the dummy line.

Various embodiments may provide a method in which resistances of the memory elements in a non-volatile memory device (e.g. magnetic random access memory (MRAM), phase change random access memory (PCRAM), resistive random access memory (RRAM)) may be accurately read out or measured. Conventional direct two point measurement methods may not reflect the actual device resistance accurately due to series resistances such as resistances due to selection transistors, column switches and parasitic resistances along the read/write path. Various embodiments may provide a method to accurately measure the resistances of the memory elements to facilitate statistical analysis. Various embodiments may seek to filter out the series resistances or balance out the series resistances in calculation. Various embodiments may be tolerant to CMOS process variation. Various embodiments may be generic to different array architectures.

Various embodiments may provide a method to characterize NVM device performances. Various embodiments may provide a controlled experiment or method to find root of the failure in NVM chips. Various embodiments may prevent unnecessary repeated attempts to address silicon failures.

In various embodiments, the first selection component may be activated via a first word line directly coupled to a gate electrode of the first selection component. The second selection component may be activated via a second word line directly coupled to a gate electrode of the second selection component. The first selection component may be activated and the second selection component may be deactivated in order to allow the first current to flow along the memory line while disallowing the second current to flow along the dummy line. The first selection component may be deactivated and the second selection component may be activated to disallow the first current to flow along the memory line while allowing the second current to flow along the dummy line.

In various embodiments, the first current and the second current may be portions of a continuous constant current generated by a current source. In other words, the current source may be configured to provide a continuous constant current. The first current and the second current may be different portions at different times of the continuous constant current. When the first selection component is activated and the second selection component is deactivated, the continuous constant current may flow through the memory line to form the first current. No current or an insubstantial current may flow through the dummy line. Subsequently, when the first selection component is deactivated and the second selection component is activated, the continuous constant current may flow through the dummy line to form the second current No current or an insubstantial current may flow through the memory line. The second current may be substantially the same as the first current.

In various embodiments, a selection component, such as a transistor (may also be referred to as a selection transistor), may be activated or switched on when a substantial current flows through the selection component. For instance, for a metal oxide field effect transistor (MOSFET), a substantial current above the sub-threshold current may flow between the source and drain terminals of the MOSFET when a gate voltage above or equal to the threshold voltage is applied to the gate terminal of the MOSFET to activate or switch on the MOSFET. In various embodiments, a selection component such as a transistor may be deactivated or switched off when no current or an insubstantial current (e.g. a sub-threshold current) flows through the selection component. For instance, for the MOSFET, only the sub-threshold current may flow between the source and drain terminals of the MOSFET when a gate voltage below the threshold voltage is applied to the gate terminal of the MOSFET to deactivate or switch off the MOSFET. In other words, the current flowing through the selection component when the selection component is activated or switched on is more than the current flowing through the selection component when the selection component is deactivated or switched off. A transistor may be or include a MOSFET such as an n-channel MOSFET (NMOS) or a p-channel MOSFET (PMOS). A transistor may alternatively be or include a bipolar junction transistor (BJT).

In various embodiments, the resistance of the memory element may be determined further based on the first current. In various embodiments, the resistance of the memory element may be determined further based on a difference between the first potential difference and the second potential difference.

In various embodiments, an end of the memory line and an end of the dummy line may be directly coupled to a common bit line. In various embodiments, the first potential difference may be measured across the memory line and the common bit line. For avoidance of doubt, references to potential difference measured across a line may mean the potential difference is measured across at least a portion of the line. In other words, the first potential difference may be measured across at least a portion of the common bit line in addition to at least a portion of the memory line. In various embodiments, the second potential difference may be measured across the dummy line and the common bit line. The second potential difference may be measured across at least a portion of the common bit line in addition to at least a portion of the dummy line. In various embodiments, common bit line or the portion of the common bit line may include a column switch such that the first potential difference is measured across the column switch and the second potential difference is measured across the same column switch. In general, the common bit line or the portion of the common bit line may include an electrical component such that the first potential difference is measured across the electrical component and the second potential difference is measured across the same electrical component.

In various embodiments, an end of the memory line and an end of the dummy line may be directly coupled to a common source line. In various embodiments, the first potential difference may be measured across the memory line and the common source line. The first potential difference may be measured in across at least a portion of the common source line in addition to at least a portion of the memory line. In various embodiments, the second potential difference may be measured across the dummy line and the common source line. The second potential difference may be measured across at least a portion of the common source line in addition to at least a portion of the dummy line. The common source line or the portion of the common line may include a column switch such that the first potential difference is measured across the column switch and the second potential difference is measured across the same column switch. In general, the common source line or the portion of the common source line may include an electrical component such that the first potential difference is measured across the electrical component and the second potential difference is measured across the same electrical component.

In various embodiments, a first end of the memory line and a first end of the dummy line may be directly coupled to a common bit line and a second end of the memory line and a second end of the dummy line may be coupled to a common source line. The common bit line and/or the common source line may include one or more electrical components such as column switches such that the first potential difference is measured across the electrical components and the second potential difference is measured across the same electrical components.

In various embodiments, the second selection component may have substantially the same resistance as the first selection component.

FIG. 3 shows a schematic 300 of a circuit arrangement for determining a resistance of a memory element 302 may be provided according to various embodiments. The circuit arrangement may include the memory element 302 and a first selection component 304 coupled to the memory element 302 along a memory line 306. The circuit arrangement may also include a second selection component 308 along a dummy line 310. The circuit arrangement may further include a current source 312 configured to apply a first current 314 to the memory element 302 and the first selection component 304 along the memory line 306. The current source 312 may be further configured to apply a second current 316 to the second selection component 308 along the dummy line 310. The circuit arrangement may additionally include a voltage measurement circuit 318 configured to measure a first potential difference across the memory line 306. The first potential difference and the second potential difference may be measured for determining the resistance of the memory element 302. The voltage measurement circuit 318 may be further configured to measure a second potential difference across the dummy line 310. The circuit arrangement may also include a control circuit 320 configured to activate the first selection component 304 and deactivate the second selection component 308 to apply the first current 314. The circuit arrangement may be further configured to deactivate the first selection component 304 and activate the second selection component 308 to apply the second current 316.

In other words, the circuit arrangement may include a memory line 306 passing through a memory element 302 and a first selection component 304. The circuit arrangement may also include a dummy line 310 passing through a second selection component 308. The circuit arrangement may further include a current source 312 configured to apply a first current 314 to the memory line 306 and further configured to apply a second current 316 to the dummy line 310. The circuit arrangement may additionally include a voltage measurement circuit 318 configured to measure a first potential difference across the memory line 306 and further configured to measure a second potential difference across the dummy line 310. The circuit arrangement may also include a control circuit 320 configured to switch on the first selection component 304 and to switch off the second selection component 308 to allow the first current 314 to flow along the memory line 306 while disallowing the second current 316 to flow along the dummy line 310. The control circuit 320 may be also configured to switch off the first selection component 304 and to switch on the second selection component 308 to disallow the first current 314 to flow along the memory line 306 while allowing the second current 316 to flow along the dummy line 310.

In various embodiments, the first selection component 304 may be a MOSFET such as an n-channel metal oxide semiconductor field effect transistor (NMOS) or a p-channel metal oxide semiconductor field effect transistor (PMOS). In various embodiments, the second selection component 308 may be a metal oxide semiconductor field effect transistor (MOSFET) such as an NMOS or a PMOS. In various alternate, the first selection component 304 and/or the second selection component 308 may be or may include other transistors such as a bipolar junction transistor or transmission gates. The memory element may be or may include a magnetic tunneling junction (MTJ). In various alternate embodiments, the memory element may be or may include a phase change memory element or a resistive memory element.

In various embodiments, the circuit arrangement may include a first word line directly coupled to a control electrode of the first selection component 304. The circuit arrangement may also include a second word line directly coupled to a control electrode of the second selection component 308.

In various embodiments, the current source 312 may be configured to generate a continuous constant current including the first current 314 and the second current 316. In other words, the current source 312 may be configured to provide a continuous constant current. The first current 314 and the second current 316 may be different portions at different times of the continuous constant current. When the first selection component 304 is activated and the second selection component 308 is deactivated, the continuous constant current may flow through the memory line 306 to form the first current 314. No current or an insubstantial current may flow through the dummy line 310. Subsequently, when the first selection component 304 is deactivated and the second selection component 308 is activated, the continuous constant current may flow through the dummy line 310 to form the second current 316. No current or an insubstantial current may flow through the memory line 306. The second current 316 may be substantially the same as the first current 314.

In various embodiments, the circuit arrangement may include a common bit line directly coupled to an end of the memory line 306 and an end of the dummy line 310. In various embodiments, the first potential difference may be measured across the memory line 306 and the common bit line. The first potential difference may be measured across at least a portion of the common bit line in addition to at least a portion of the memory line 306. The second potential difference may be measured across the dummy line 310 and the common bit line. The second potential difference may be measured across at least a portion of the common bit line in addition to at least a portion of the dummy line 310.

In various embodiments, the common bit line may include a column switch (or electrical component) such that the first potential difference is measured across the column switch (or electrical component) and the second potential difference is measured across the same column switch (or electrical component).

In various embodiments, the circuit arrangement may include a common source line directly coupled to an end of the memory line 306 and an end of the dummy line 310. In various embodiments, the first potential difference may be measured across the memory line and the common source line. The first potential difference may be measured across at least a portion of the common source line in addition to at least a portion of the memory line 306. In various embodiments, the second potential difference may be measured across the dummy line 310 and the common source line. The second potential difference may be measured across at least a portion of the common source line in addition to at least a portion of the dummy line 310.

In various embodiments, the common source line may include a column switch (or electrical component) such that the first potential difference is measured across the column switch (or electrical component) and the second potential difference is measured across the same column switch (or electrical component).

In various embodiments, the circuit arrangement may be or may include a magnetic random access memory (MRAM) cell. The memory element may be a magnetic tunneling junction (MTJ). Each memory cell may include a MTJ and a selection component (i.e. the first selection component 304) which acts as a switch. Common selection components may include but are not limited to n-channel metal oxide semiconductor field effect transistors (NMOS), p-channel metal oxide semiconductor field effect transistors (PMOS) and transmission gates etc. In an example of NMOS as a selection component, a first electrode (e.g. the bottom electrode) of the MTJ may be directly coupled to a first controlled (e.g. the drain) electrode of the NMOS transistor and a second (e.g. the top electrode) of the MTJ may be directly coupled to a first line such as the common bit line (BL). A second controlled (e.g. the source) electrode of the NMOS transistor may be directly coupled to a second line such as the common source line (SL). The control electrode or the gate of the NMOS transistor may be coupled to the word line (WL). A large number of memory cells may be integrated in an array of m rows by n columns. Memory cells in the same row may share a common WL coupled to the gates of the NMOS transistors. The second electrodes of the memory elements in the same column may be directly coupled to the same common bit line (BL), and the second controlled electrodes of the selection transistors may be directly coupled to the same common source line (SL). The local common BL and common SL of each column may be coupled to the global master BL (MBL) and master SL (MSL) respectively through two local column switches. The first selection component may be switched on and the second selection component may be switched off in order to allow the first current to flow along the memory line while disallowing the second current to flow along the dummy line. The first selection component may be switched off and the second selection component may be switched on to disallow the first current to flow along the memory line while allowing the second current to flow along the dummy line.

In various embodiments, a first end of the memory line 306 and a first end of the dummy line 308 may be directly coupled to a common bit line and a second end of the memory line 306 and a second end of the dummy line 308 may be coupled to a common source line. The common bit line and/or the common source line may include one or more electrical components such as column switches such that the first potential difference is measured across the electrical components and the second potential difference is measured across the same electrical components.

In various embodiments, the second selection component 308 may have substantially the same resistance as the first selection component 304.

Figure 4:
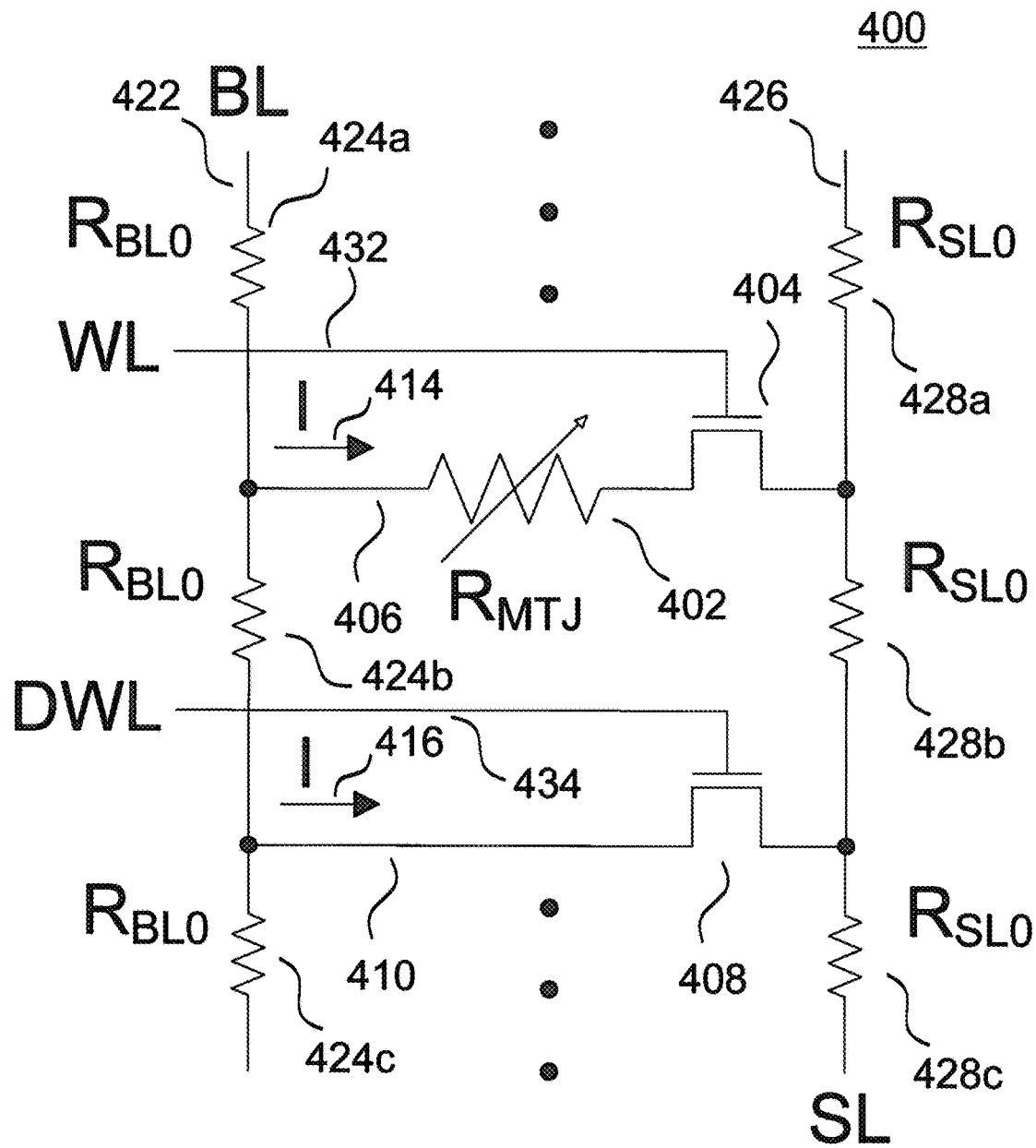
FIG. 4 shows a schematic of a circuit arrangement for determining a resistance of a memory element according to various embodiments.

FIG. 4 shows a schematic 400 of a circuit arrangement for determining a resistance of a memory element 402 according to various embodiments. The circuit arrangement may include the memory element 402 and a first selection component 404 coupled to the memory element 402 along a memory line 406. The circuit arrangement may also include a second selection component 408 along a dummy line 410. The circuit arrangement may further include a current source (not shown in FIG. 4) configured to apply a first current 414 to the memory element 402 and the first selection component 404 along the memory line 406. The current source may be further configured to apply a second current 416 to the second selection component 408 along the dummy line 410. The circuit arrangement may additionally include a voltage measurement circuit (not shown in FIG. 4) configured to measure a first potential difference across the memory line 406. The voltage measurement circuit may be further configured to measure a second potential difference across the dummy line 410. The first potential difference and the second potential difference may be measured for determining the resistance of the memory element 402. The circuit arrangement may also include a control circuit configured to activate the first selection component 404 and deactivate the second selection component 408 to apply the first current 314. The circuit arrangement may be further configured to deactivate the first selection component 404 and activate the second selection component 408 to apply the second current 416.

In various embodiments, the memory line 406 (or cell) and the dummy line 410 (or cell) may be arranged at different rows of an array. The memory line 406 (or cell) and the dummy line 410 (or cell) may be arranged in the same column of the array.

The memory element 402 may be a MTJ. In various alternate embodiments, the memory element 402 may be other types of non-volatile memory elements such as a phase change memory element (in PCRAM) or resistive memory element (in RRAM). The MTJ 402 may be directly coupled to a first selection component 404 such as a NMOS as shown in FIG. 4. In various alternate embodiments, the first selection component 404 may be a PMOS transistor, a bipolar junction transistor (BJT) or a transmission gate etc. A first electrode of the MTJ 402 may be directly coupled to a first controlled electrode of the first NMOS 404. A memory line 406 may include the MTJ 402 and the first NMOS transistor 404. In other words, the first NMOS 404 may be coupled to the MTJ 402 along the memory line 406. The first NMOS 404 and the MTJ 402 may form the memory cell.

Additionally, the circuit arrangement may further include a second selection component 408 along a dummy line 410. The second selection component 408 may be a second NMOS as shown in FIG. 4. In various alternate embodiments, the second selection component 408 may be a PMOS transistor, a bipolar junction transistor (BJT) or a transmission gate etc. The second NMOS 408 may form the dummy cell. The first selection component 404 and the second selection component 408 may be identical or substantially similar. The second selection component 408 may have substantially the same resistance as the first selection component 404.

The control circuit may include a word line (WL) 432 and a dummy word line (DWL) 434. The word line 432 may be directly coupled to a control electrode (i.e. a gate electrode) of the first NMOS 404. The first NMOS 404 may be activated by application of a voltage via the word line 432. Similarly, the dummy word line 434 may be directly coupled to a control electrode (i.e. a gate electrode) of the second NMOS 408. The second NMOS 408 may be activated by application of a voltage via the dummy word line 434.

A first end of the memory line 406 and a first end of the dummy line 410 may be directly coupled to a common bit line (BL) 422. Resistances ($R_{BL0}$) 424a, 424b, 424c may be present along the common bit line 422. Resistances 424a, 424b, 424c represent the parasitic resistances between neighbouring cells. For instance, resistance 424b represents the parasitic resistance between the memory cell and the dummy cell along the common bit line, i.e. the parasitic resistance along the common bit line between memory line 406 and dummy line 410.

A second end of the memory line 406 and a second end of the dummy line 410 may be directly coupled to a common source line (SL) 426. Resistances ($R_{SL0}$) 428a, 428b, 428c may be present along the common source line 426. Resistances 428a, 428b, 428c also represent parasitic resistances between neighbouring cells. For instance, resistance 428b represents the parasitic resistance between the memory cell and the dummy cell along the common source line, i.e. the parasitic resistance alone the common source line between memory line 406 and dummy line 410.

Parasitic resistances may be based on the dimensions and resistivity of the metal line used to implement the common bit line and/or the common source line. For matching purposes, the two metal lines are normally designed with the same metal layer of the same dimension. Essentially, $$R_{BL0} = R_{SL0} = R_0 \quad (1)$$

and the parasitic resistances along the two metal lines (column direction) may be balanced.

The total parasitic resistances along the data path of each of the n cells in one column is (n+m+1) $R_0$. n is the number of memory cells in the column. m is the number of dummy cells in the column. For instance, FIG. 4 shows one memory cell and one dummy cell and the resistance of the path of a first current passing through common bit line 422, memory line 406 and the common source line 426 may be $$R_{BL0} + R_{SL0} + R_{SL0} = 3R_0 \quad (2)$$

The resistance of the path of a second current passing through common bit line 422, dummy line 410 and the common source line 426 may be $$R_{BL0} + R_{BL0} + R_{SL0} = 3R_0. \quad (3)$$

As such, the total parasitic resistances along the current path for each cell in a column of n cells is (n+m+1) $R_0$.

When a characterization current $I_{char}$ 414 is forced into the memory line 406, the voltage across the common bit line 422, the memory line 406 and the common source line 426 (i.e. the voltage measured from bit line 422 to source line 426 and including memory line 406), $V_{BS}$, may be provided by $$V_{BS} = I_{char}[R_{MTJ} + R_{ST} + R_{CS} + (n+m+1)R_0] \quad (4)$$

where $R_{CS}$ is the resistance of the column switches and $R_{ST}$ is the resistance of the selection transistor. The characterization current $I_{char}$ may be a portion of a constant current provided by the current source.

When a further portion of the constant current 416 provided by the current source is forced to the dummy line 410, the voltage across the common bit line 422, the dummy line 410 and the common source line 426 (i.e. the voltage measured from bit line 422 to source line 426 and including dummy line 410), $V_{BSD}$, may be provided by $$V_{BSD} = I_{char}[R_{ST} + R_{CS} + (n+m+1)R_0] \quad (5)$$

$R_{MTJ}$ may be accurately characterized by dividing the voltage difference by the characterization current. In other words, $R_{MTJ}$ may be provided by $$R_{MTJ} = (V_{BS} - V_{BSD})/I_{char} \quad (6)$$

In various embodiments, effects of parasitic resistances 424a, 424b, 424c along common bit line 422 and effects of parasitic resistances 428a, 428b, 428c along the common source line 426 on the determined resistance of memory element 402 may be reduced or eliminated by fabricating the common bit line 422 and the common source line 426 having the same dimensions and with the same metal. The resistance 428b in which the first current 414 flows through (but in which the second current 416 does not flow through) may be compensated with resistance 424b in which the second current 416 flows through (but in which the first current 414 does not flow through).

The constant current may be forced into the memory line 406 by activating the first NMOS 404 and deactivating the second NMOS 408. On the other hand, the constant current may be forced into dummy line 410 by deactivating the first NMOS 404 and activating the second NMOS 408. In other words, the first current may be applied to the memory line 406 when the first NMOS 404 is activated and the second NMOS 408 is deactivated. In contrast, the second current may be applied to the dummy line 410 when the first NMOS 404 is deactivated and the second NMOS 408 is activated.

Figure 5:
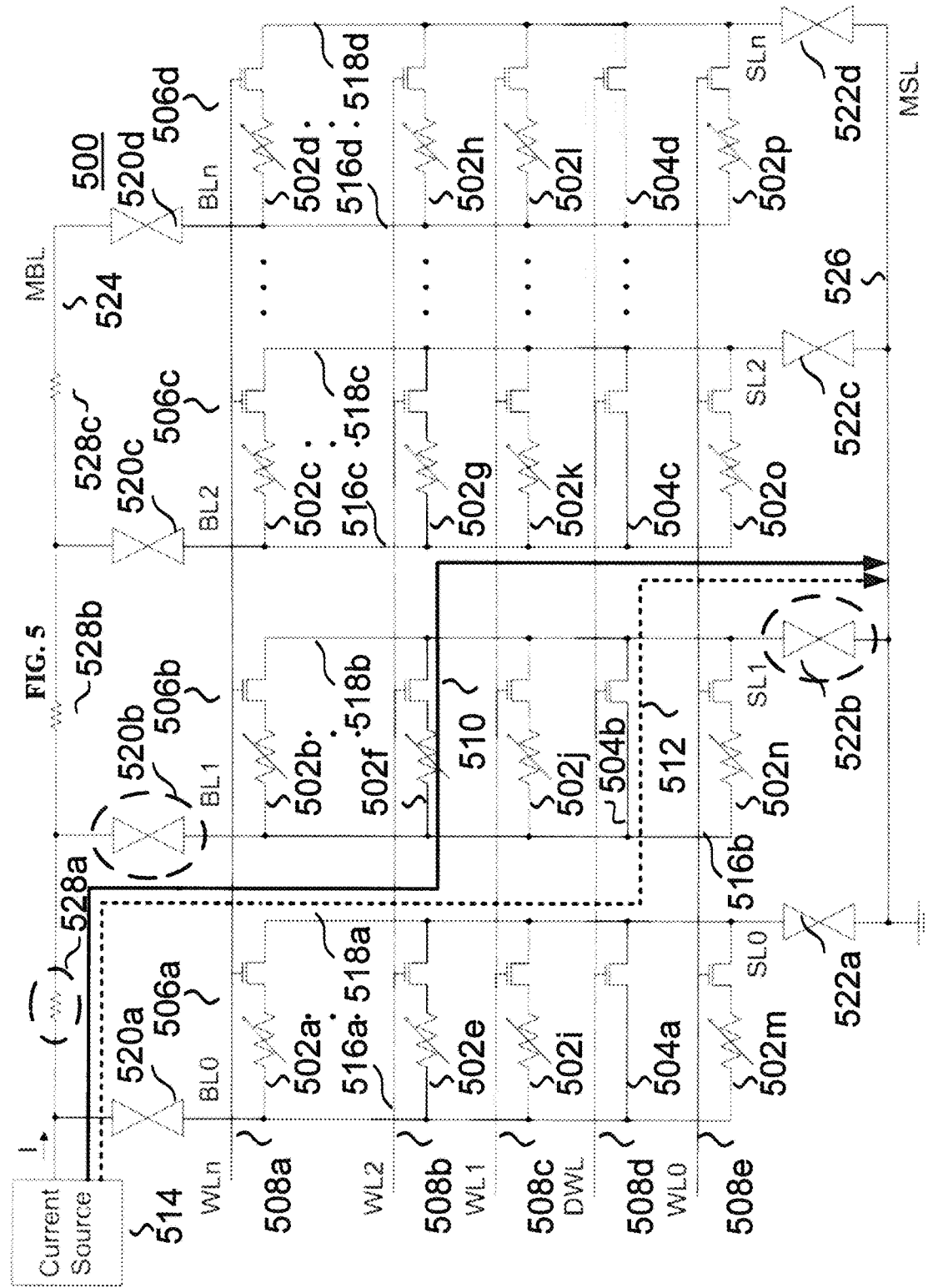
FIG. 5 shows a schematic of a circuit arrangement for determining a resistance of a memory element according to various embodiments.

FIG. 5 shows a schematic 500 of a circuit arrangement for determining a resistance of a memory element according to various embodiments. The circuit arrangement may include a plurality of memory lines 502a, 502b, 502c, 502d, 502e, 502f, 502g, 502h, 502i, 502j, 502k, 502l, 502m, 502n, 502o and 502p and a plurality of dummy lines 504a, 504b, 504c, 504d. As seen in FIG. 5, the plurality of memory lines 502a etc. and plurality of dummy lines 504a etc. may be arranged in an array according to a plurality of columns 506a, 506b, 506c, 506d and a plurality of rows 508a, 508b, 508c, 508d. In various embodiments, the array may be arranged in any number of columns (one or more) and any number of rows (one or more). The dummy lines 504a, 504b, 504c, 504 may be arranged in a single row, such as row 508d as shown in FIG. 5. Each dummy line 504a, 504b, 504c or 504d may be dedicated to characterize the memory lines in the same column. For instance, dummy line 504a may be used to determine the resistances of memory elements along memory lines 502a, 502e, 502i and 502m in column 506a. Dummy line 504b may be used to determine the resistances of memory elements along memory lines 502b, 502f, 502j and 502n in column 506b.

For avoidance of doubt, each memory line 502a, 502b, 502c, 502d, 502e, 502f, 502g, 502h, 502i, 502j, 502k, 502l, 502m, 502n, 502o and 502p may include a first selection component and a memory element such as in memory line 406 shown in FIG. 4. Each dummy line 504a, 504b, 504c, 504d may include a second selection component such as in dummy line 410 in FIG. 4. The memory elements and selection components in FIG. 5 are not labeled for improved clarity.

As shown in FIG. 5, the first selection component along memory line 502f may be activated to apply a first current 510 (also referred to as a normal current) through the memory element and the first selection component along memory line 502f. The second selection component along the dummy line 504b may be deactivated. The selection components along memory lines 502b, 502j and 502n may also be deactivated.

Subsequently, the second selection component along dummy line 504b may be activated to apply a second current 512 (also referred to as a characterization current) through the second selection component along the dummy line 504b. The first selection component along memory line 510 may be activated. The selection components along memory lines 502b, 502j and 502n may also be deactivated.

The first current 510 and the second current 512 may be different portions of a constant, continuous current generated by current source 514. The first current 510 and the second current 512 may be the constant, continuous current at different times. The constant, continuous current generated by current source 514 may be routed to form the first current 510 along the memory line 502f when the first selection component along memory line 502f is activated (and the selection components along dummy line 504b and memory lines 502b, 502j and 502n are deactivated). The constant, continuous current generated by current source 514 may be routed to form the second current 512 along the dummy line 504b when the second selection component along dummy line 504b is activated (and the selection components along memory lines 502b, 502f, 502j and 502n are deactivated).

While FIG. 5 shows 4 memory lines 502b, 502f, 502j and 502n (corresponding to 4 memory cells, each cell having one memory line) and 1 dummy line 504b (corresponding to 1 dummy cell) in one column of the array, various embodiments may include any number of memory lines (or cells) and any number of dummy lines (or cells) in a column. Various embodiments may also include any number of lines (or cells) in a row.

As shown in FIG. 5, the array may include a plurality of common bit lines 516a, 516b, 516c, 516d. Additionally or alternatively, the array may include a plurality of common source lines 518a, 518b, 518c, 518d. A first end of memory lines 502a, 502e, 502i, 502m and a first end of dummy line 504a may be directly coupled to common bit line 516a. A second end of memory lines 502a, 502e, 502i, 502m and a second end of dummy line 504a may be directly coupled to common source line 518a. Similarly, a first end of memory lines 502b, 502f, 502j, 502n and a first end of dummy line 504b may be directly coupled to common bit line 516b. A second end of memory lines 502b, 502f, 502j, 502n and a second end of dummy line 504b may be directly coupled to common source line 518b. A first end of memory lines 502c, 502g, 502k, 502o and a first end of dummy line 504c may be directly coupled to common bit line 516c. A second end of memory lines 502c, 502g, 502k, 502o and a second end of dummy line 504c may be directly coupled to common source line 518c. A first end of memory lines 502d, 502h, 502l, 502p and a first end of dummy line 504d may be directly coupled to common bit line 516d. A second end of memory lines 502d, 502h, 502l, 502p and a second end of dummy line 504d may be directly coupled to common source line 518d.

Each of the common bit lines 516a, 516b, 516c, 516d may include a column switch 520a, 520b, 520c, 520d respectively. In various embodiments, each of the common bit lines 516a, 516b, 516c, 516d may include one or more column switches and/or one or more electrical components. Likewise, each of the common source lines 518a, 518b, 518c, 518d may include one or more column switch 522a, 522b, 522c, 522d respectively. In various embodiments, each of the common source lines 518a, 518b, 518c, 518d may include one or more column switches and/or one or more electrical components.

The common bit lines 516a, 516b, 516c, 516d may be coupled to a main bit line (MBL) 524. The common source lines 518a, 518b, 518c, 518d may be coupled to a main source line (MSL) 526. The main bit line 524 may include one or more resistances 528a, 528b, 528c. The main source line 526 may also include one or more resistances (not shown in FIG. 5). In addition, each of the common bit lines 516a, 516b, 516c, 516d may also include resistances such as resistances 424a, 424b, 424c in FIG. 4 but not shown in FIG. 5. Each of the common source lines 518a, 518b, 518c, 518d may include resistances such as resistances 428a, 428b, 428c in FIG. 4 but not show in FIG. 5. The resistances may be parasitic resistances. The current source 514 may be coupled to the main bit line 524. The main source line 526 may be coupled to ground.

As illustrated in FIG. 5, the first current 510 may pass through a portion of the main bit line 524 upon activation of the first selection component in memory line 502f. The first current 510 may also pass through a portion of the common bit line 516b, the memory line 502f, a portion of the common source line 518b as well as a portion of the common source line 526. The second current 512 may pass through a portion of the main bit line 524 upon activation of the second selection component along dummy line 504b. A first potential difference may be measured across the portion of the main bit line 524, the portion of the common bit line 516b, the memory line 502f, the portion of the common source line 518b as well as the portion of the common source line 526.

The second current 512 may pass through a portion of the main bit line 524 upon activation of the second selection component in memory line 504b. The second current 512 may also pass through a portion of the common bit line 516b, the dummy line 504b, a portion of the common source line 518b as well as a portion of the common source line 526. A second potential difference may be measured across the portion of the main bit line 524, the portion of the common bit line 516b, the dummy line 504b, the portion of the common source line 518b as well as a portion of the common source line 526.

As such, the first current 510 may pass through the resistance 528a along the portion of the main bit line 524, column switch 520b along the portion of the common bit line 516a, the memory element and the first selection component along memory line 502f and column switch 522b along the portion of the common source line 518b. The first potential difference may be measured across resistance 528a, column switch 520b, the memory element and the first selection component along memory line 502f and column switch 522b. The second current 512 may pass through the resistance 528a along the portion of the main bit line 524, column switch 520b along the portion of the common bit line 516a, the second selection component along dummy line 504 and column switch 522b along the portion of the common source line 518b. The second potential difference may be measured across resistance 528a, column switch 520b, the second selection component along memory line 502f and column switch 522b.

The first current 510 may be substantially the same as the second current 512. Further, the first selection component may have substantially the same resistance as the second selection component. As such, the resistance of the memory element along the memory line 502f may be determined based on the first potential difference and the second potential difference, i.e. by subtracting the second potential difference from the first potential difference. The resistance of the memory element may be further determined from the first current (or the second current), i.e. by dividing the results of the subtraction by the first current (or the second current).

As can be seen from FIG. 5, both the first current 510 and the second current 512 may pass through the same portion of the main bit line including resistance 528a. Further, both the first current 510 and the second current 512 may pass through the same column switches 520b, 522b. Both the first current 510 and the second current 512 may pass through the same portion of the main source line 526.

As such, various embodiments may help eliminate the mismatch due to the parasitic resistances and the column switches which both the first current and the second current pass through, resulting in better controlled spread of the resistance of the memory element. Further, the first current 510 and the second current 512 may both pass through further parasitic resistances and/or electrical components, such as parasitic resistances along the portion of the main source line 526. Various embodiments may also help eliminate mismatch due such further parasitic resistances and/or electrical components.

Mismatches of parasitic resistances along the common bit line 516b and the common source line 518b may also be reduced or eliminated as highlighted earlier for FIG. 4.

Figure 6:
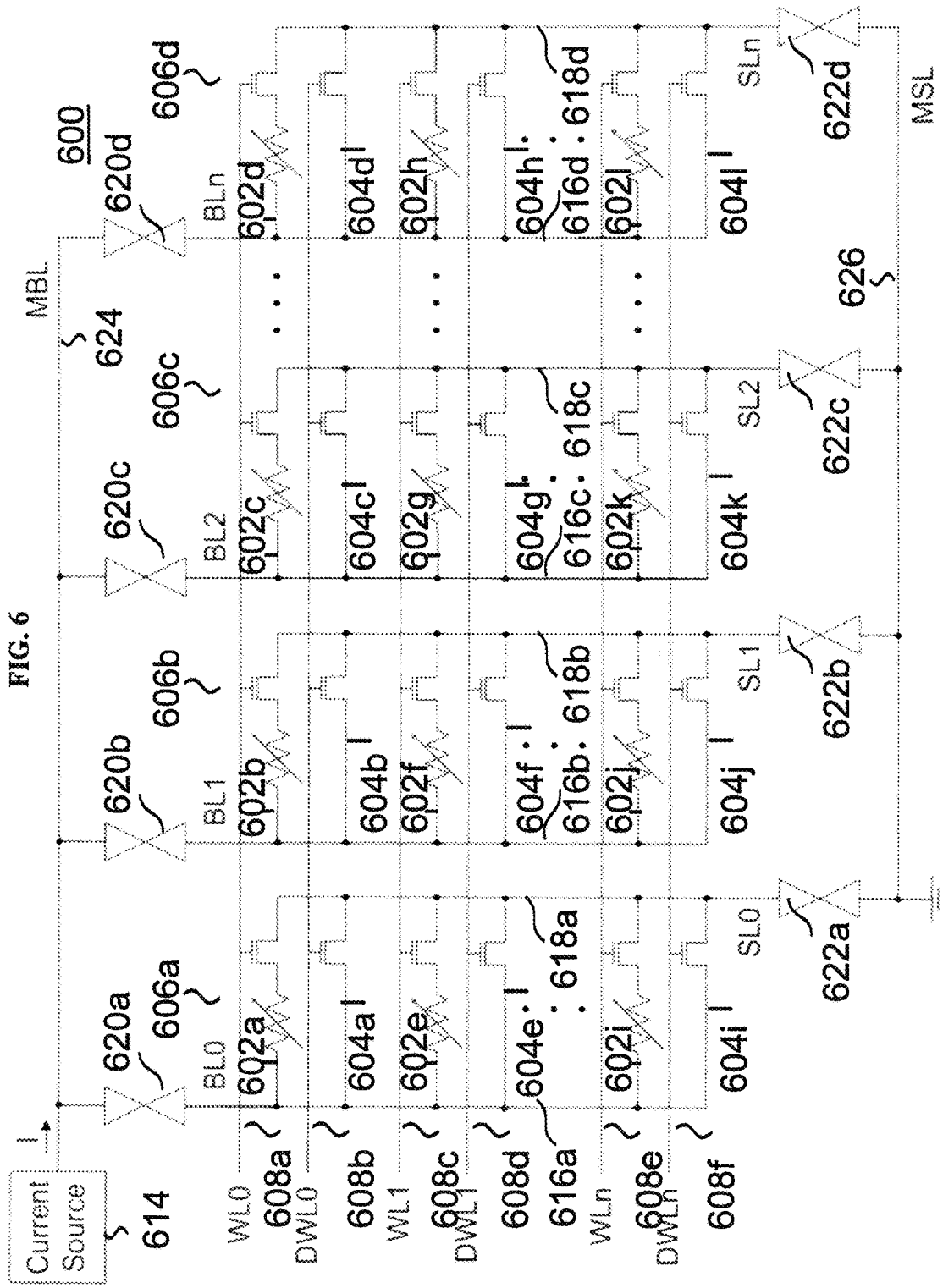
FIG. 6 shows a schematic of a circuit arrangement for determining a resistance of a memory element according to various embodiments.

FIG. 6 shows a schematic 600 of a circuit arrangement for determining a resistance of a memory element according to various embodiments. The array may include a plurality of memory lines (or cells) 602a, 602b, 602c, 602d, 602e, 602f, 602g, 602h, 602i, 602j, 602k, 602l and a plurality of dummy lines (or cells) 604a, 604b, 604c, 604d, 604e, 604f, 604g, 604h, 604i, 604j, 604k, 604l. The number of dummy lines may be equal to the number of memory lines. The plurality of memory lines 602a etc. and plurality of dummy lines 604a etc. may be arranged in an array according to a plurality of columns 606a, 606b, 606c, 606d and a plurality of rows 608a, 608b, 608c, 608d, 608e, 608f. In various embodiments, the array may be arranged in any number of columns (one or more) and any even number of rows (two or more). Each memory line (or cell) may have or may be paired with a dedicated dummy line (or cell) such that there are alternating rows of memory lines (or cells) and dummy lines (or cells) in the array. For instance, row 608a including memory lines 602a, 602b, 602c, 602e may be paired with row 608b including dummy lines 604a, 604b, 604c, 604d. Memory line 602a may have or may be paired with dummy line 604a, memory line 602b may have or may be paired with dummy line 604b, 602c may have or may be paired with dummy line 604c and 602d may have or may be paired with dummy line 604d. Various embodiments may provide for an improved accuracy characterization of a memory element. The memory lines and dummy lines may be arranged in alternate rows.

For avoidance of doubt, each memory line 602a, 602b, 602c, 602d, 602e, 602f, 602g, 602h, 602i, 602j, 602k, 602l may include a first selection component and a memory element such as in memory line 406 shown in FIG. 4. Each dummy line 604a, 604b, 604c, 604d, 604e, 604f, 604g, 604h, 604i, 604j, 604k, 604l may include a second selection component such as in dummy line 410 in FIG. 4. The memory elements and selection components in FIG. 6 are not labeled for improved clarity.

As shown in FIG. 6, the array may include a plurality of common bit lines 616a, 616b, 616c, 616d. Additionally or alternatively, the array may include a plurality of common source lines 618a, 618b, 618c, 618d. A first end of memory lines 602a, 602e, 602i, and a first end of dummy lines 604a, 604e, 604i may be directly coupled to common bit line 616a. A second end of memory lines 602a, 602e, 602i and a second end of dummy lines 604a, 604e, 604i may be directly coupled to common source line 618a. Similarly, a first end of memory lines 602b, 602f, 602j and a first end of dummy lines 604b, 604f, 604j may be directly coupled to common bit line 616b. A second end of memory lines 602b, 602f, 602j and a second end of dummy lines 604b, 604f, 604j may be directly coupled to common source line 618b. A first end of memory lines 602c, 602g, 602k and a first end of dummy lines 604c, 604g, 604k may be directly coupled to common bit line 616c. A second end of memory lines 602c, 602g, 602k and a second end of dummy lines 604c, 604g& 604k may be directly coupled to common source line 618c. A first end of memory lines 602d, 602h, 602l and a first end of dummy lines 604d, 604h, 604l may be directly coupled to common bit line 616d. A second end of memory lines 602d, 602h, 602l and a second end of dummy lines 604d, 604h, 604l may be directly coupled to common source line 618d.

Each of the common bit lines 616a, 616b, 616c, 616d may include a column switch 620a, 620b, 620c, 620d respectively. In various embodiments, each of the common bit lines 616a, 616b, 616c, 616d may include one or more column switches and/or one or more electrical components. Likewise, each of the common source lines 618a, 618b, 618c, 618d may include a column switch 622a, 622b, 622c, 622d respectively. In various embodiments, each of the common source lines 618a, 618b, 618c, 618d may include one or more column switches and/or one or more electrical components.

The common bit lines 616a, 616b, 616c, 616d may be coupled to a main bit line (MBL) 624. The common source lines 618a, 618b, 618c, 618d may be coupled to a main source line (MSL) 626. The main bit line 624 may include one or more resistances (not shown in FIG. 6). The main source line 626 may also include one or more resistances (not shown in FIG. 6). In addition, each of the common bit lines 616a, 616b, 616c, 616d may also include resistances such as resistances 424a, 424b, 424c in FIG. 4 but not shown in FIG. 6. Each of the common source lines 618a, 618b, 618c, 618d may include resistances such as resistances 428a, 428b, 428c in FIG. 4 but not show in FIG. 6. The resistances may be parasitic resistances.

The circuit arrangement may include a current source 614 coupled to the main bit line 624. The current source 614 may be configured to generate a continuous, constant current. The continuous constant current may be a first current to pass through a memory element and a first selection component along a memory line, for instance memory line 602b, when the first selection component is activated. The second selection component along paired dummy line 604b may be deactivated. The other selection components along the other memory lines 602f, 602j and dummy lines 604f, 604j in column 606b may also be deactivated.

Subsequently, the continuous, constant current may be a second current to pass through the second selection component along dummy line 604b when the second selection component is activated. The selection component along paired memory line 602b may be deactivated. The other selection components along the other memory lines 602f, 602j and dummy lines 604f, 604j in column 606b may also be deactivated.

A first potential difference may be measured across a portion of the main bit line 624, a portion of the common bit line 616b, the memory line 602b, a portion of the common source line 618b as well as a portion of the main source line 626. As such, the first potential difference may be measured across column switches 620b, 622b as well as the memory element and first selection component along memory line 602b. A second potential difference may be measured across a portion of the main bit line 624, a portion of the common bit line 616b, the dummy line 604b, a portion of the common source line 618b as well as a portion of the main source line 626. The second potential difference may be measured across column switches 620b, 622b as well as the second selection component along dummy line 604b. The first selection component and the second selection component may have substantially the same resistance.

The resistance of the memory element may be determined based on the first potential difference and the second potential difference. The resistance of the memory element may be determined further based on the first current or the second current. The resistance may be determined by subtracting the second potential difference from the first potential difference and dividing the results by the first current (or the second current).

As both the first potential difference and the second potential difference are measured across the column switches 620b, 622b and both the first current and the second current pass through the column switches 620b, 622b, the effects of the column switches 620b, 622b on the determined resistance of the memory element may be eliminated or reduced.

Parasitic resistances and/or electrical components may also be present along the portion of the main bit line 624, portion of the common bit line 616b, portion of the common source line 618b and/or portion of the common source line 626 in which both the first current and the second current pass through and across which the first potential difference and the second potential difference are measured. The effects of these parasitic resistances and/or electrical components are similarly eliminated or reduced in determining the resistance of the memory element.

Further, effects of parasitic resistances along portions of the common bit line in which only one of the first current and the second current pass through may be reduced or eliminated as such parasitic resistances may be at least partially compensated by parasitic resistances along portions of the common source line in which only the other current of the first current and the second current pass through. Correspondingly, effects of parasitic resistances along portions of the common source line in which only one of the first current and the second current pass through may be reduced or eliminated as such parasitic resistances may be at least partially compensated by parasitic resistances along portions of the common bit line in which only the other current of the first current and the second current pass through.

Figure 7:
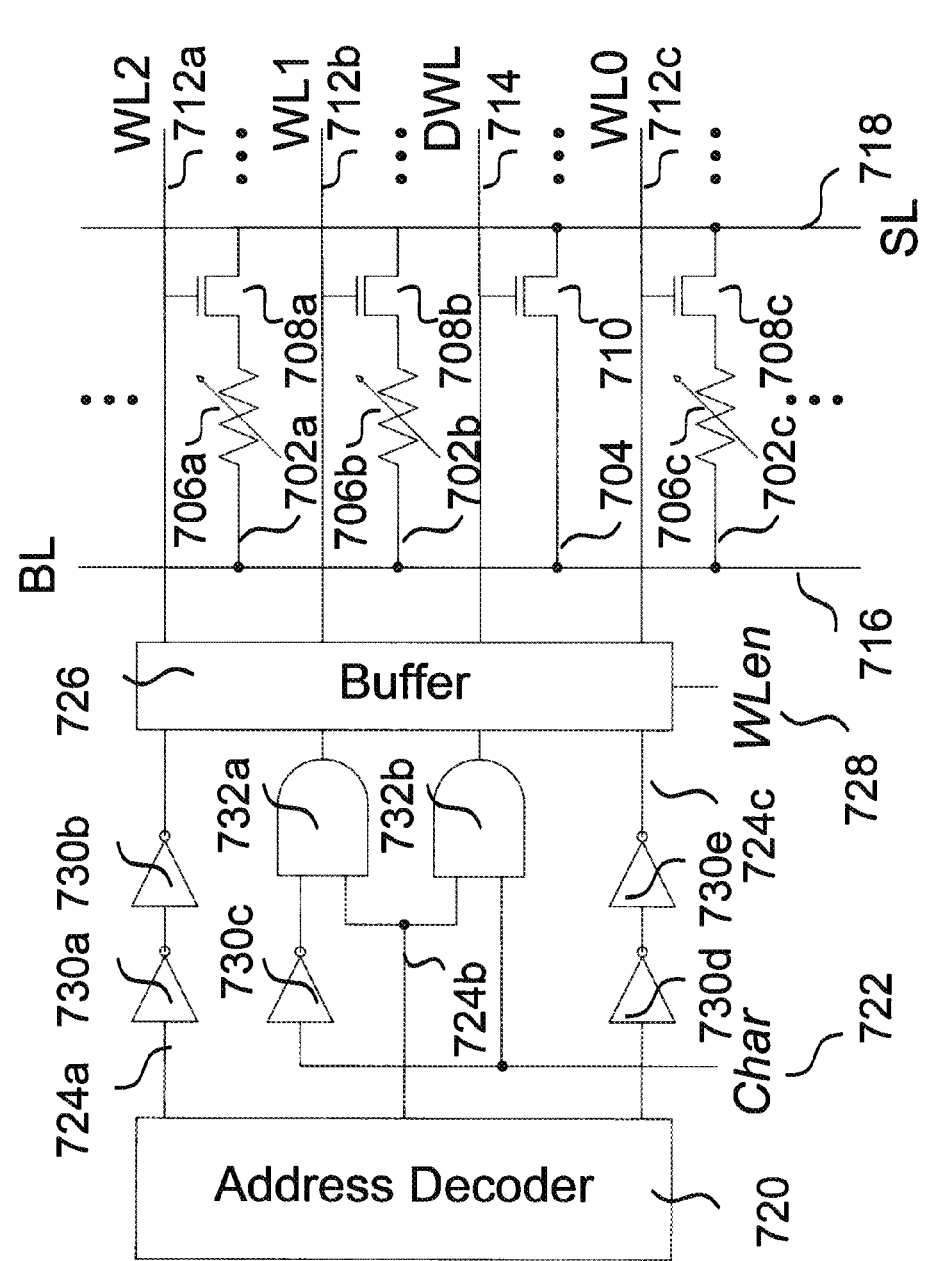
FIG. 7 shows a schematic of a circuit arrangement for determining a resistance of a memory element according to various embodiments.

FIG. 7 shows a schematic 700 of a circuit arrangement for determining a resistance of a memory element according to various embodiments. The circuit arrangement may include one or more memory lines 702a, 702b, 702c. The circuit arrangement may further include one or more dummy lines 704. Each memory line 702a, 702b, 702c may include a memory element and a first selection component. For instance, memory line 702a may include a memory element 706a and a first selection component 708a, memory line 702b may include a memory element 706b and a first selection component 708b and memory line 702c may include a memory element 706c and a first selection component 708c. Each dummy line 704 may include a second selection component. Dummy line 704 includes second selection component 710.

The one or more memory lines 702a, 702b, 702c and the one or more dummy lines 704 may be arranged in a column. A first end of the one or more memory lines 702a, 702b, 702c and a first end of the one or more dummy lines 704 may be directly coupled to a common bit line (BL) 716. A second end of the one or more memory lines 702a, 702b, 702c and a second end of the one or more dummy lines 704 may be directly coupled to a common source line (SL) 718.

Each of the one or more memory lines 702a, 702b, 702c may be addressed by a word line (WL). Each of the one or more dummy lines 704 may be addressed by a dummy word line (DWL). The first selection components 708a, 708b, 708c and the second selection components 710 may be transistors such as MOSFETS. Word lines 712a, 712b, 712c may each be directly coupled to a control electrode (e.g. gate electrode) of a first selection component 708a, 708b, 708c. For instance, word line 712a is directly coupled to a control electrode of first selection component 708a, word line 712b is directly coupled to a control electrode of first selection component 708b and word line 712c is directly coupled to a control electrode of first selection component 708c. Dummy word line 714 may be each directly coupled to a control electrode (e.g. gate electrode) of a second selection component 710.

In various embodiments, a dummy cell (or dummy line) and a memory cell (or dummy line) on the same column may share one row address. For instance, dummy line 704 may share one row address with memory line 702b. The cells (or lines) may be addressed by an address decoder 720. A signal such as digital signal Char 722 may be introduced to differentiate the normal operation mode and the characterization mode. In other words, the signal 722 may be used to address only one of dummy line 704 and memory line 702b at any time. The signal 722 may be used to toggle the access to the dummy line 704 and memory line 702b under the two operation modes.

The address decoder 720 may be directly coupled to a plurality of address lines 724a, 724b, 724c. Address line 724a may be used to provide a signal to word line 712a. Address line 724c may be used to provide a signal to word line 712c. Address line 724b may be used to provide a signal to one of word line 712b or dummy word line 714. The address lines 724a, 724b, 724c may be coupled to buffer 726. The buffer 726 may be activated by word line enable signal WL, 728. In other words, the memory lines 702a, 702b, 702c and dummy line 704 may be addressed by address decoder 720 through address lines 724a, 724b, 724c, word lines 712a, 712b, 712c and dummy word line 714 when buffer 726 is enabled by word line enable signal 728.

Address line 724a may include inverters 730a, 730b. Address line 724b may be coupled to first inputs of AND gates 732a, 732b. An inverter 730c may be also coupled to a second input of AND gate 732a. The signal 722 may be coupled to the AND gate 732a via inverter 730c and is directly coupled to AND gate 732b. The outputs of AND gates 732a, 732b are coupled to word line 712b or dummy word line 714 via buffer 726. Address line 724c may include inverters 730d, 730e.

When the row address of memory line 702b and dummy line 704 is asserted by decoder 720, only one of AND gates 732a, 732b will output a logic '1' while the remaining AND gate will output a logic '0'. Whether AND gate 732a or AND gate 732b will output a logic '1' may depend on signal 722. Consequently, only one of the first selection component 708b and the second selection component 710 may be activated although the memory line 702b and dummy line 704 share a single row address. Inverter 730a, 730b, 730d, 730e may serve to reduce differences in delays of signals travelling in address lines 724a, 724c and signal travelling in address line 724b.

In various embodiments, when the circuit arrangement is under normal operation mode, signal 722 is at logic '0'. Hence, when address line 724b is addressed by decoder 720, output of AND gate 732a may be at logic '1' and the first selection component 808b may be activated. Output of AND gate 732b may remain at logic '0' whether or not address line 724b is asserted. As such, the circuit arrangement may be used in normal operations such as writing of data into the memory elements or reading data from the memory elements. When the circuit arrangement is under characterization mode, signal 722 is at logic '1'. Hence, when address line 724b is addressed by decoder 720, output of AND gate 732b may be at logic '1' and the second selection component 710 may be activated. Output of AND gate 732a may remain at logic '0' whether or not address line 724b is asserted. A second current may then flow through dummy line 704 and a second potential difference may be measured. The second potential difference may be used to determine the resistance of memory elements 706a, 706c. As such, dummy line 704 may be addressed under characterization mode to characterize memory elements 706a, 706c.

The control circuit may include address decoder 720. As highlighted above, the control circuit may be configured to activate the first selection component 706a or 706c and deactivate the second selection component 710 to apply the first current and further configured to deactivate the first selection component 706a or 706c and activate the second selection component 710 to apply the second current.

In various alternate embodiments, the memory line 702b may be addressed by applying signal 722 having logic '0' to determine the resistance of memory element 706b prior or after applying signal 722 having logic '1'. In this situation, the control circuit may be configured to activate the first selection component 706b and deactivate the second selection component 710 to apply the first current and further configured to deactivate the first selection component 706b and activate the second selection component 710 to apply the second current. The control circuit may be configured to activate the first selection component 708b and deactivate the second selection component 710 and further configured to deactivate the first selection component 708b and activate the second selection component 710 based on a signal 722.

In various embodiments, dummy line 704 may share one row address with memory line 702c.

In various embodiments, the circuit arrangement may be a STT-MRAM array. In various embodiments, the read/write drivers may be designed in voltage mode. In various embodiments, multiplexing may be required to apply the first and second currents in to determine the resistance of a memory cell.

Figure 8:
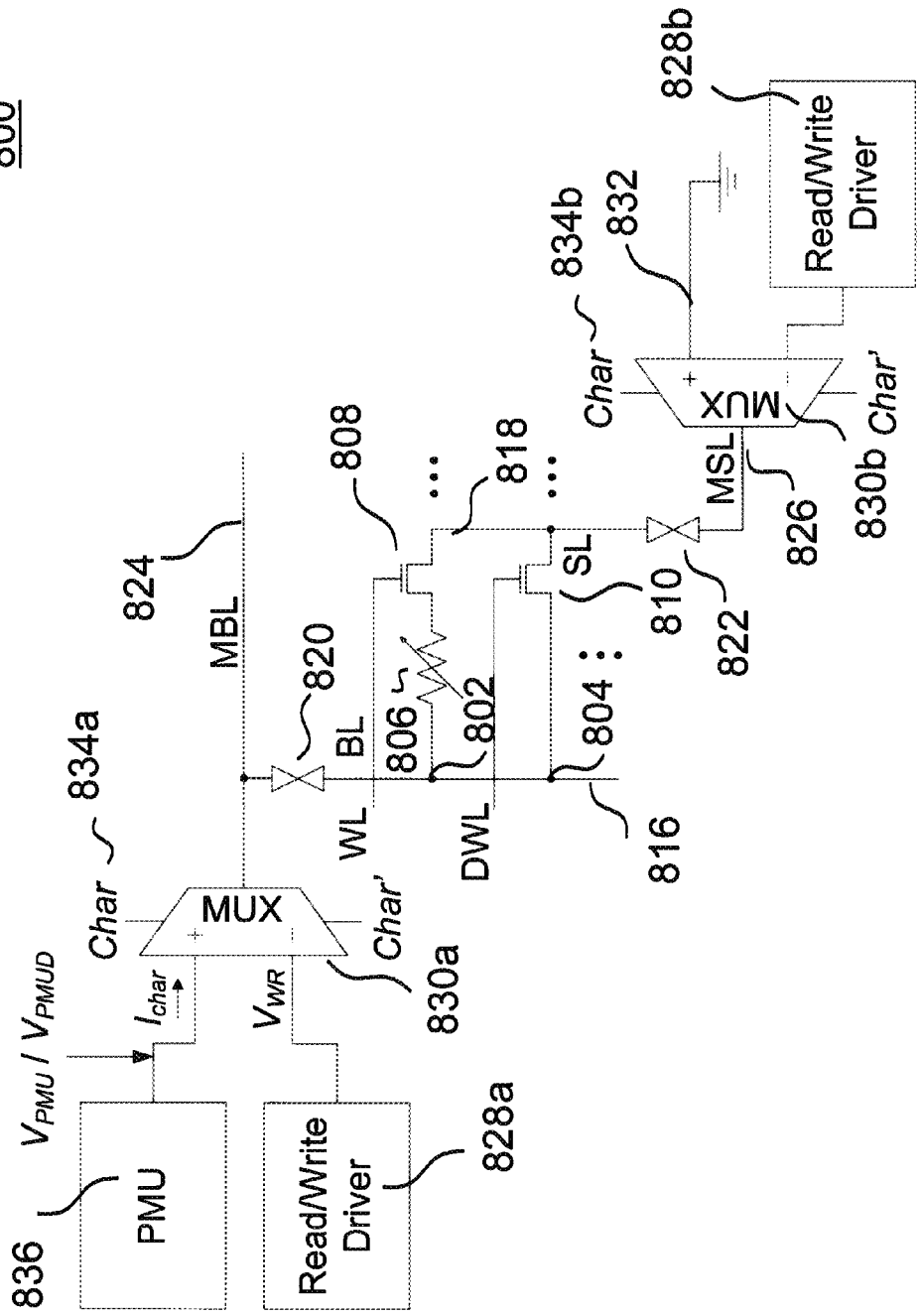
FIG. 8 shows a schematic of a circuit arrangement for determining a resistance of a memory element according to various embodiments.

FIG. 8 shows a schematic 800 of a circuit arrangement for determining a resistance of a memory element according to various embodiments. The circuit arrangement may include a memory element 806 and a first selection component 808 along a memory line 802. The circuit arrangement may further include a second selection component 810 along a dummy line 804. First ends of memory line 802 and dummy line 804 may be coupled to a common bit line 816. Second ends of memory line 802 and dummy line 804 may be coupled to a common source line 818. The common bit line 816 may be coupled to main bit line (MBL) 824 via column switch 820. The common source line 818 may be coupled to main source line (MSL) 826 via column switch 822.

A first read/write driver 828a may be coupled to the main bit line 824 via a first multiplexer 830a. A second read/write driver 828b may be coupled to the main source line 826 via a second multiplexer 830b. The first multiplexer 830a may be further coupled to an External Parametric Measurement Unit (PMU) 836. The second multiplexer 830b may be further coupled by line 832 to ground.

During normal operation mode, signal Char 834a having logic '0' may be applied to first multiplexer 830a and signal Char 834b having logic '0' may be applied to second multiplexer 830b. Main bit line 824 may be connected to first read/write driver 828a via first multiplexer 830a and main source line 826 may be connected to second read/write driver 828b via second multiplexer 830b. The read/write drivers 828a, 828b may generate voltages for normal operations such as reading from and writing to memory element 806.

During characterization mode, signal Char 834a having logic '1' may be applied to first multiplexer 830a and signal Char 834b having logic '1' may be applied to second multiplexer 830b. Main bit line 824 may be connected to the External Parametric Measurement Unit (PMU) 836 via first multiplexer 830a. Main source line 826 may be further connected to grounded line 832 via second multiplexer 830b. The PMU 836 may be configured to generate a current. The current may be a continuous, constant current. The PMU 836 may be configured in force-current-measure-voltage (FIMV) mode to generate the current and to measure the first and second potential differences. Signals 834a, 834b may be the same signal.

In various embodiments, main bit line 824 may be multiplexed by the signal 834a between the current signal of PMU 836 and the voltage signal of internal read/write driver 828a. Main source line 826 may be multiplexed by signal 834b between the ground signal and the voltage signal of the internal read/write driver 828b. Various embodiments enable to allow generation of current for characterization of memory elements in arrays in which read/write drivers are designed in voltage mode, such as STT-MRAM arrays.

Figure 9:
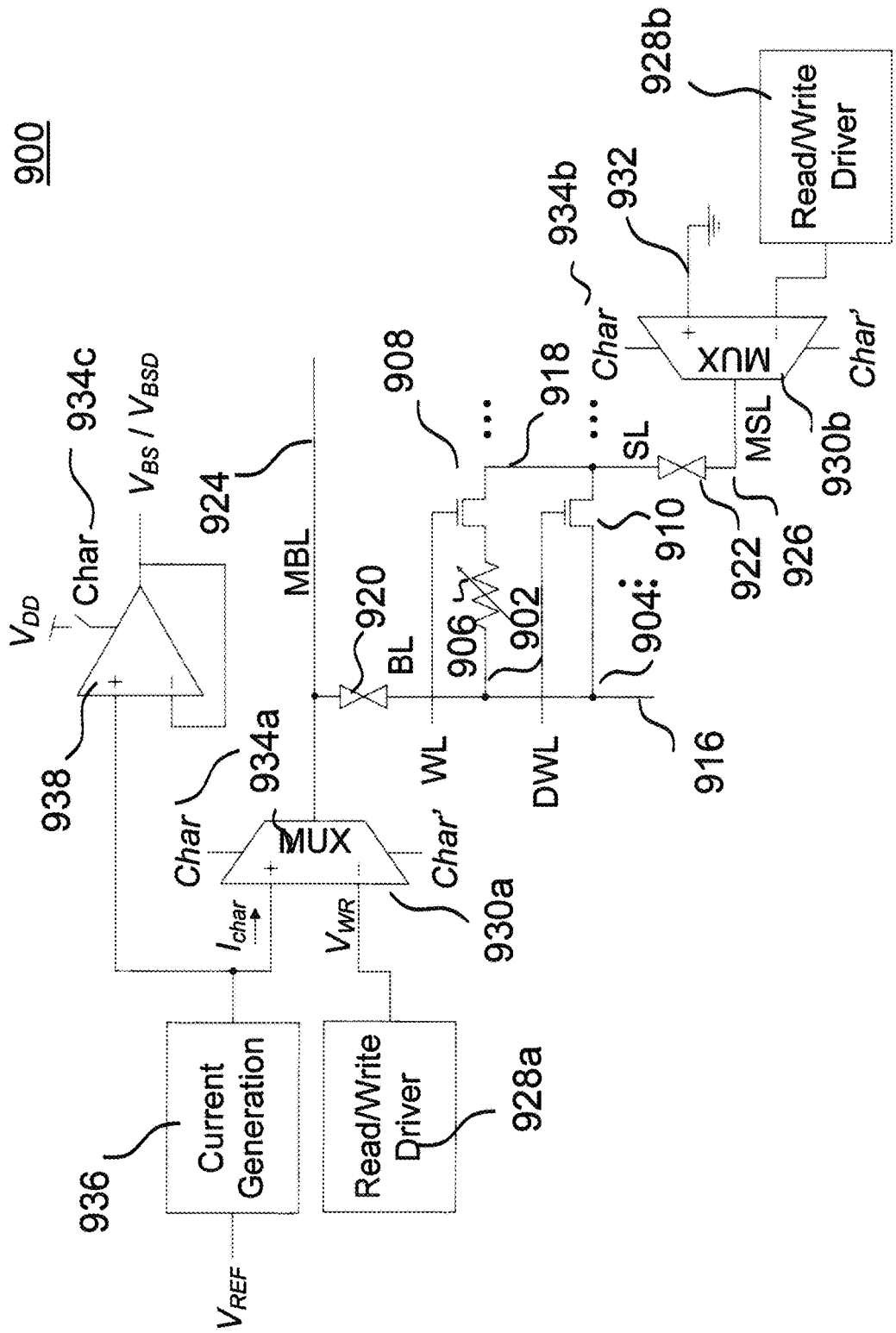
FIG. 9 shows a schematic of a circuit arrangement for determining a resistance of a memory element according to various embodiments.

Internal current generation circuit and amplifier configured as voltage buffer may alternatively be used to perform FIMV. FIG. 9 shows a schematic 900 of a circuit arrangement for determining a resistance of a memory element according to various embodiments. The circuit arrangement may include a memory element 906 and a first selection component 908 along a memory line 902. The circuit arrangement may further include a second selection component 910 along a dummy line 904. First ends of memory line 902 and dummy line 904 may be coupled to a common bit line 916. Second ends of memory line 902 and dummy line 904 may be coupled to a common source line 918. The common bit line 916 may be coupled to main bit line (MBL) 924 via column switch 920. The common source line 918 may be coupled to main source line (MSL) 926 via column switch 922.

A first read/write driver 928a may be coupled to the main bit line 924 via a first multiplexer 930a. A second read/write driver 928b may be coupled to the main source line 926 via a second multiplexer 930b. The first multiplexer 930a may be further coupled to a current generation circuit 936. The first multiplexer 930a may also be coupled to an amplifier 938 configured as a voltage follower (voltage buffer). The second multiplexer 930b may be further coupled by line 932 to ground.

The current generation circuit 936 may be configured to receive input voltage $V_{REF}$ which may be supplied externally (i.e. from an external source) or from an internal bandgap reference circuit. The current generation circuit 936 may be further configured to generate the first and second currents. The current generation circuit 936 may be configured to generate a constant continuous current, which forms the first and second current at different times. The first multiplexer 930a may be coupled to a first input of the amplifier 938. The output of the amplifier 938 may be coupled to the second input of the amplifier 938. The amplifier 938 may measure the first or second potential differences at the first input and outputs the first or second potential differences ($V_{BS}/V_{BSD}$). In other words, amplifier 938 (configured as a voltage follower, may receive an input voltage and output substantially the same voltage. The amplifier 938 may be configured to measure the first and second potential differences. The amplifier 938 may be activated or enabled by a signal Char 934c. Upon assertion of the signal 934c, the supply terminals of amplifier 938 may be connected to VDD to enable or activate the amplifier 938.

During normal operation mode, signal Char 934a having logic '0' may be applied to first multiplexer 930a and signal Char 934b having logic '0' may be applied to second multiplexer 930b. Main bit line 924 may be connected to first read/write driver 928a via first multiplexer 930a and main source line 926 may be connected to second read/write driver 928b via second multiplexer 930b. The read/write drivers 928a, 928b may generate voltages for normal operations such as reading from and writing to memory element 906.

During characterization mode, signal Char 934a having logic '1' may be applied to first multiplexer 930a and signal Char 934b having logic '1' may be applied to second multiplexer 930b. Main bit line 924 may be connected to the current generation circuit 936 as well as amplifier 938 via first multiplexer 930a. The amplifier 938 may be enabled by signal 934c. Main source line 926 may be further connected to grounded line 932 via second multiplexer 930b. The current generation circuit 936 may be configured to generate a current. The current may be a continuous, constant current. The amplifier 938 may be configured to measure the first and second potential differences. Signals 934a, 934b, 934c may be the same signal.

In various embodiments, main bit line 924 may be multiplexed by the signal 934a between the current signal of current generation circuit 936 and the voltage signal of internal read/write driver 828a. Main source line 826 may be multiplexed by signal 934b between the ground signal and the voltage signal of the internal read/write driver 928b. The first and second currents may be comparable to a read current as the characterization operation is essentially a read operation and the first and second read currents may be comparable to the read current for avoiding disturbances, such as affecting data stored in the memory elements. In other words, the continuous, constant current may have about the same order magnitude as a read current in normal operation mode.

Figure 10:
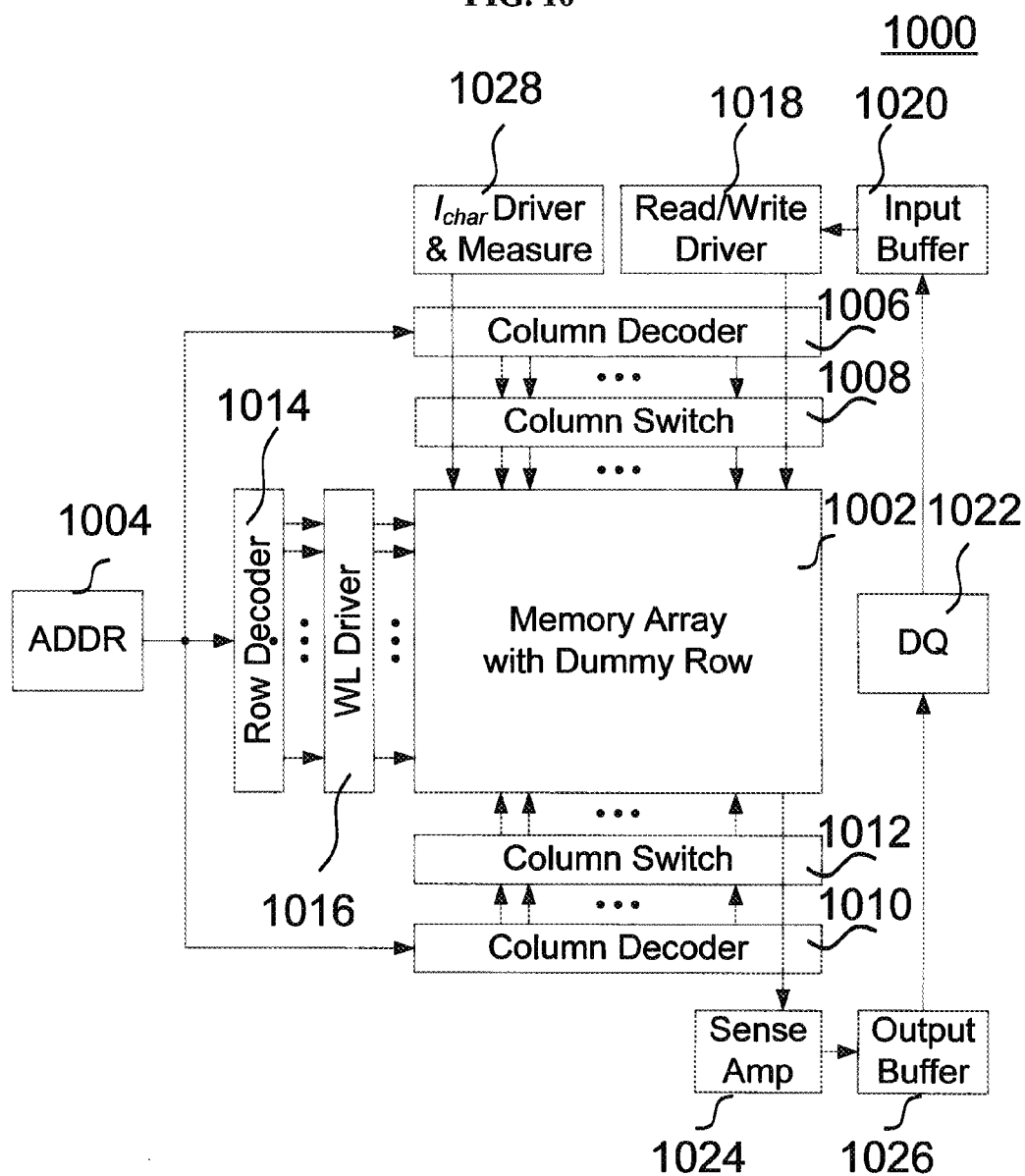
FIG. 10 shows a schematic of a circuit arrangement for determining a resistance of a memory element according to various embodiments.

FIG. 10 shows a schematic 1000 of a circuit arrangement for determining a resistance of a memory element according to various embodiments. The circuit arrangement may include a memory array 1002. The memory array 1002 may include a plurality of memory elements along a plurality of memory lines. The memory array 1002 may also include a row of dummy lines. The memory lines and/or dummy lines may be accessed based on the address ADDR 1004 of the memory lines and/or dummy lines. The corresponding bit lines of the memory lines and/or dummy lines may be addressed using column decoders 1006 to control column switches 1008. The corresponding source lines of the memory lines and/or dummy lines may be addressed using column decoders 1010 to control column switches 1012. The corresponding word lines/dummy word lines of the memory lines and/or dummy lines may be addressed using row decoders 1014 to control row drivers 1016.

When a memory line has been addressed, a read/write driver 1018 may supply a read voltage or a write voltage for reading or writing to the memory element along the addressed memory line (cell). The data to be written may be buffered in input buffer 1020 after being read from input/output pins DQ 1022. During reading, data from the memory elements may be detected by sense amplifier 1024 and buffered in output buffer 1026. Input/output pins DQ 1022 carry the data to be read from output buffer to the external environment such as external circuitry. Various embodiments may include current drivers and/or measurement circuit arrangements 1028. Various embodiments may include the current drivers and/or measurement circuit arrangements 1028 if the data is normally written to memory elements in voltage mode and current drivers are to generate characterization current. If data is written to memory elements in current mode such as in phase change random access memory (PCRAM) arrays, the current drivers and/or measurement circuit arrangements 1028 may not be required.

Figure 11:
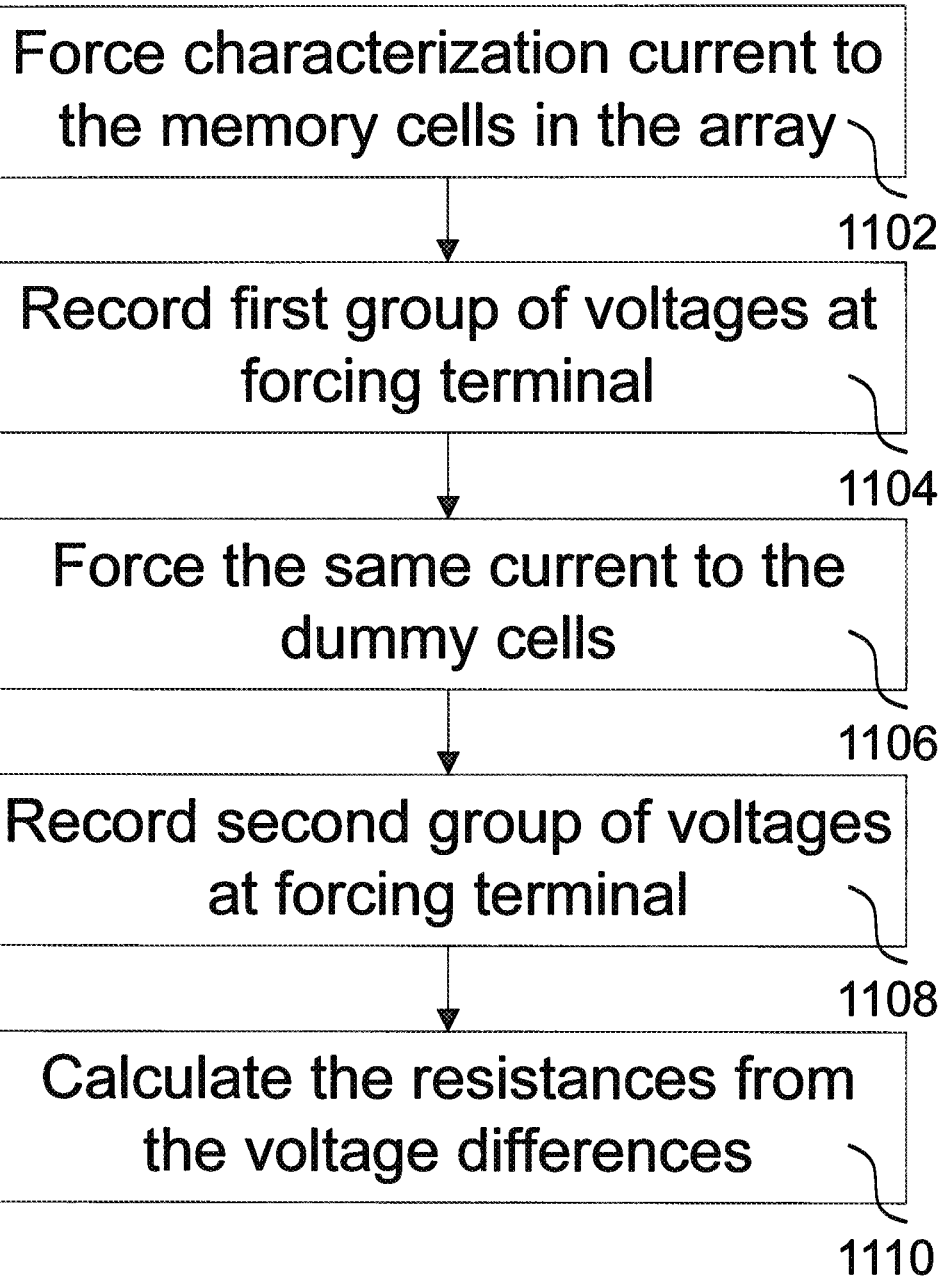
FIG. 11 is a schematic illustrating a method of determining a resistance of a memory element according to various embodiments.

FIG. 11 is a schematic 1100 illustrating a method of determining a resistance of a memory element according to various embodiments. The method may include, in 1102, forcing a characterization current to one or more memory cells in an array. The method may also include, in 1104, recording or measuring a first group of voltages at the forcing terminal. The method may further include, in 1106, forcing the same current to one or more dummy cells. The method may additionally include, in 1108, recording or measuring a second group of voltages at the forcing terminal. The method may also include, in 1110, calculating the resistances of the memory elements in the one or more memory cells based on a voltage differences between the first group of voltages and the second group of voltages. The resistance of the memory elements, e.g. MTJs, may be obtained by dividing the voltage differences by the characterization current. The forcing terminal may be a current forcing terminal.

Figure 12:
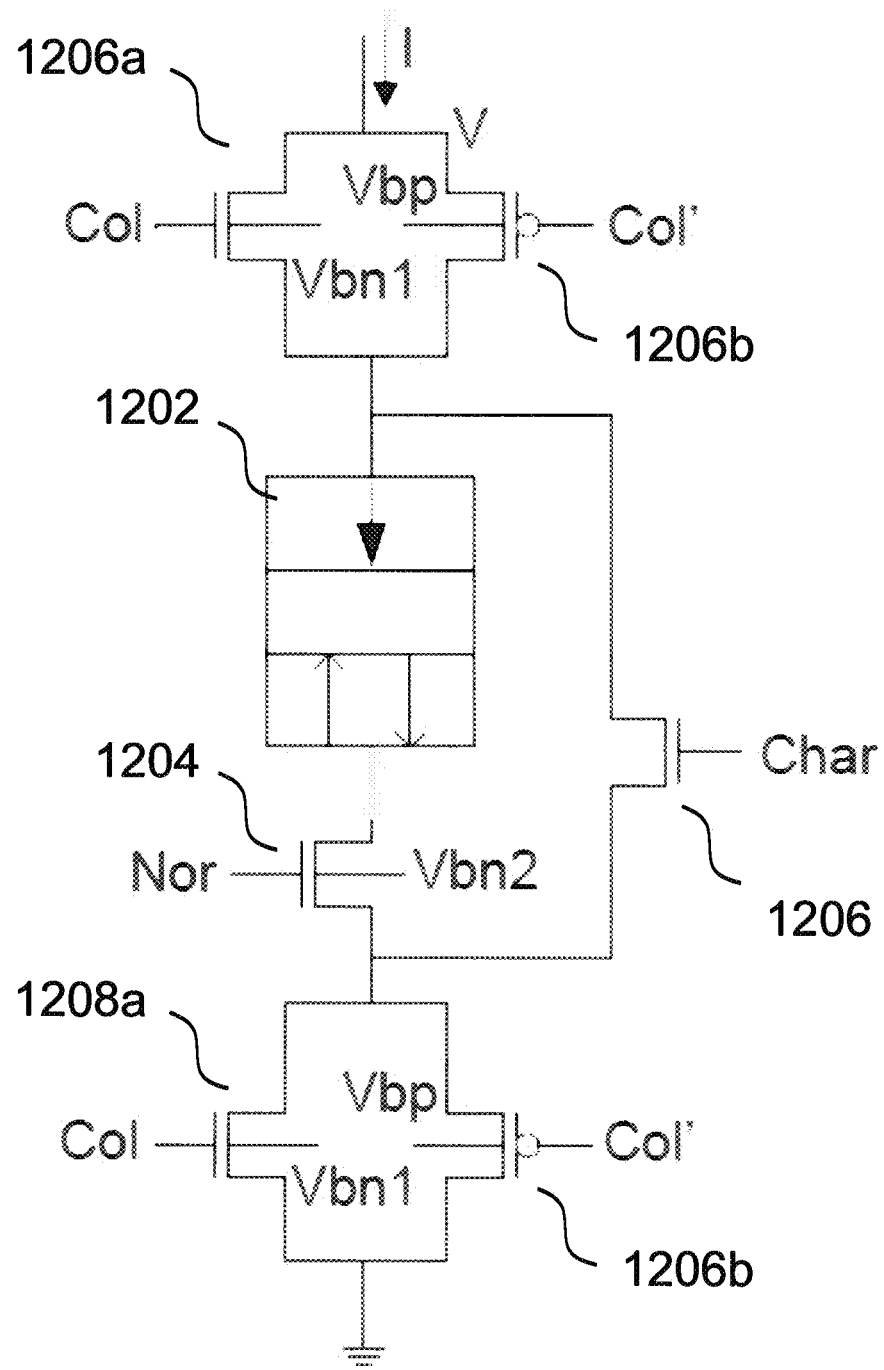
FIG. 12 is a schematic of a simulation setup used to emulate the impact of process variation on the mismatch between a memory line (or cell) and a dummy line (or cell) according to various embodiments.

Process variation may affect two parts of the circuit arrangement according to various embodiments. Process variation and affect the selection components (e.g. selection transistors) and column switches. There may be three operation corners for both the selection components (e.g. selection transistors) and column switches: Typical (denoted as T), Fast (denoted as F) and Slow (denoted as S). FIG. 12 is a schematic 1200 of a simulation setup used to emulate the impact of process variation on the mismatch between a memory line (or cell) and a dummy line (or cell) according to various embodiments. The setup in FIG. 12 uses body bias to reproduce the threshold voltages corresponding to these corners in order to isolate the problem. There are 9 pairs of corners: TT, TF, TS, FT, FS, ST, SF, SS for emulating the impact. A memory element such as a MTJ 1202 is coupled to a first selection component such as a first NMOS 1204 along a memory line. A second component such as a second NMOS 1206 along a dummy line is coupled in parallel to the memory line. A first end of the memory line and a first end of the dummy line may be coupled to a first controlled electrode of NMOS 1206a and a first controlled electrode of PMOS 1206b. The first controlled electrode of NMOS 1206a may be coupled to the first controlled electrode of PMOS 1206b. Also, the second controlled electrode of NMOS 1206a may be coupled to the second controlled electrode of PMOS 1206b. A first controlled electrode of NMOS 1208a and a first controlled electrode of PMOS 1208b may be coupled to ground. A second end of the memory line and a second end of the dummy line may be coupled to a second controlled electrode of NMOS 1208a and a second controlled electrode of PMOS 1208b. A current source may be coupled to the second controlled electrode of NMOS 1206a and the second controlled electrode of PMOS 1206b. The transistors 1206a, 1206b, 1208a, 1208b may be activated by applying a signal Col (and inverted signal Col').

Current I from the current source may then flow from transistors 1206a, 1206b towards transistors 1208a, 1208b. The current I may flow through the memory line or the dummy line depending on whether NMOS 1204 is activated (by signal Nor) or whether NMOS 1206 is activated (by signal Char). Transistors 1206a, 1206b, 1208a, 1208b may act as column switches. Transistors 1204, 1206 may act as selection components.

The body bias of NMOS 1206a, 1208a may be indicated by Vbn1 and the body bias of PMOS 1206b, 1208b may be indicated by Vbp. The body bias of NMOS 1204, 1206 may be indicated by Vbn2. The body bias Vbp, Vbn1, Vbn2 may be adjusted to reproduce the threshold voltages corresponding to the different situations. The resistance of the MTJ 1202 may be calculated 1202 may be calculated based on a first potential difference measured across transistors 1206a, 1206b, 1208a, 1208b, MTJ 1202 and transistor 1204 as well as a second potential difference measured across transistors 1206a, 1206b, 1208a, 1208b and transistor 1206. The resistance of the MTJ may be further calculated based on the current I, i.e. dividing the results of the difference in potential differences by the current I.

Figure 13A:
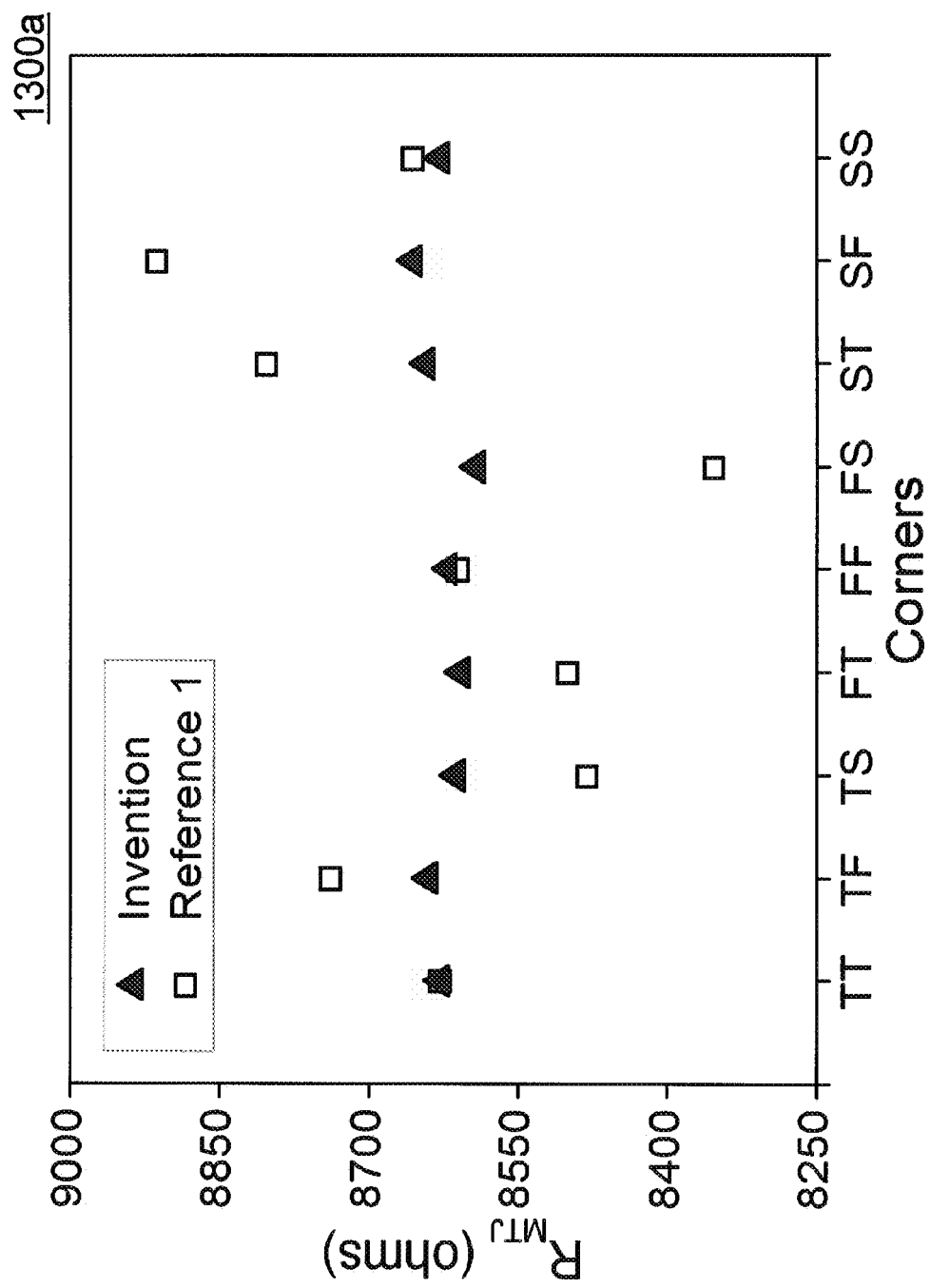
FIG. 13A shows a graph of the calculated resistance of memory cell according to various embodiments, Rmtj (ohms), against the various conditions (corners).

FIG. 13A shows a graph 1300a of the calculated resistance of memory cell according to various embodiments, Rmtj (ohms), against the various conditions (corners). The results is compared to results of a reference circuit illustrated in a reference (U.S. Pat. No. 7,929,334). As seen from FIG. 13A, the calculated resistance of the memory cell in the circuit arrangement has a lower spread compared to the calculated resistance of the reference circuit. FIG. 13B is a table 1300b comparing the standard deviations of the calculated resistance in the circuit arrangement according to various embodiments and the reference circuit. As seen in FIG. 13B, the circuit arrangement has a much lower calculated resistance (19.3 ohms) compared to the reference circuit (172.9 ohms).

Figure 14:
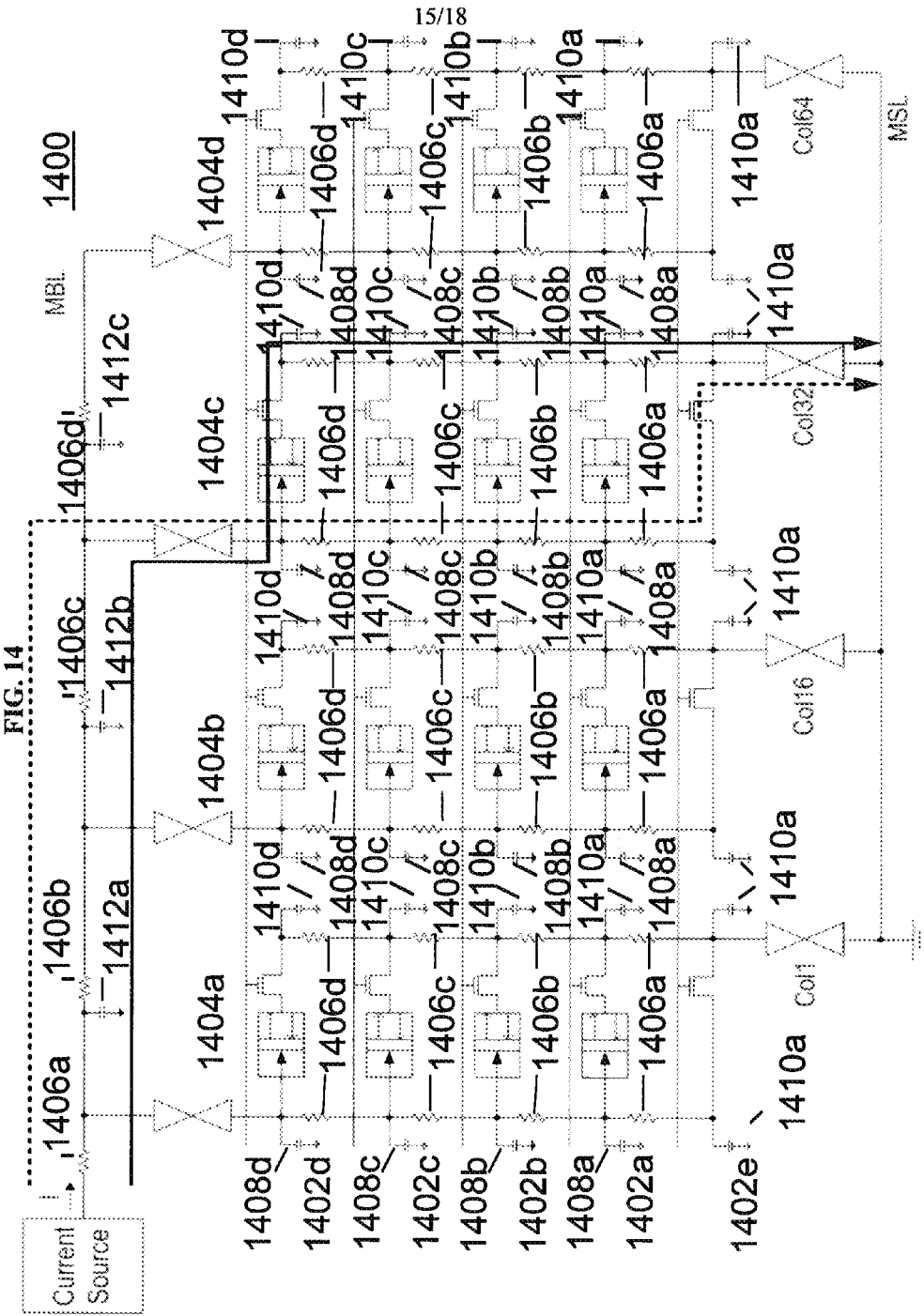
FIG. 14 is a schematic of a simulation setup used to emulate the impact of parasitic effects on the mismatch between a memory line (or cell) and a dummy line (or cell).

FIG. 14 is a schematic 1400 of a simulation setup used to emulate the impact of parasitic effects on the mismatch between a memory line (or cell) and a dummy line (or cell). FIG. 14 shows selected rows and columns in an array. As seen in FIG. 14, the memory lines may be arranged in rows 1402a, 1402b, 1402c, 1402d. 1402 may be row 1, 1402b may be row 16, 1402c may be row 32 and 1402d may be row 64 in the array. Dummy lines may be arranged in row 1402e. The memory lines and dummy lines may be also arranged in columns 1404a, 1404b, 1404c, 1404d. Column 1404a may be column 1, column 1404b may be column 16, column 1404c may be column 32 and column 1404d may be column 64 in the array.

For avoidance of doubt, the intersections of columns 1404a, 1404b, 1404c, 1404d and rows 1402a, 1402b, 1402c, 1402d may each include a memory line such as memory line 406 shown in FIG. 4. Each memory line may include a first selection component and a memory element such as in memory line 406 shown in FIG. 4. The intersections of columns 1404a, 1404b, 1404c, 1404d and row 1402e may each include a dummy line such as dummy line 410 shown in FIG. 4. Each dummy line may include a second selection component such as in dummy line 410 in FIG. 4. The memory lines, the dummy lines, the memory elements and the selection components in FIG. 14 are not labeled for improved clarity.

The simulation setup may use resistors and capacitors to simulate the parasitic effects on memory cells at junctions of rows 1, 16, 32, 64 and columns 1, 16, 32, 64. Resistor 1406a may be $R_0$, resistor 1406b may be $15R_0$, resistor 1406c may be $16R_0$, resistor 1406d may be $32R_0$, wherein $R_0$ may be about 450 mili-ohms. Capacitor 1408a may be $C_0$, capacitor 1408b may be $15C_0$, capacitor 1408c may be $16C_0$, capacitor 1408d may be $32C_0$, wherein $C_0$ may be about 0.3 fF (fermto-farads). Capacitor 1410a may be $C_1$, capacitor 1410b may be $15C_1$, capacitor 1410c may be $16C_1$, capacitor 1410d may be $32C_1$, wherein $C_1$ may be about 3 fF (fermto-farads). Capacitor 1412a may be $15C_2$, capacitor 1412b may be $16C_2$, capacitor 1412c may be $32C_2$, wherein $C_2$ may be about 6 fF (fermto-farads).

Figure 15:
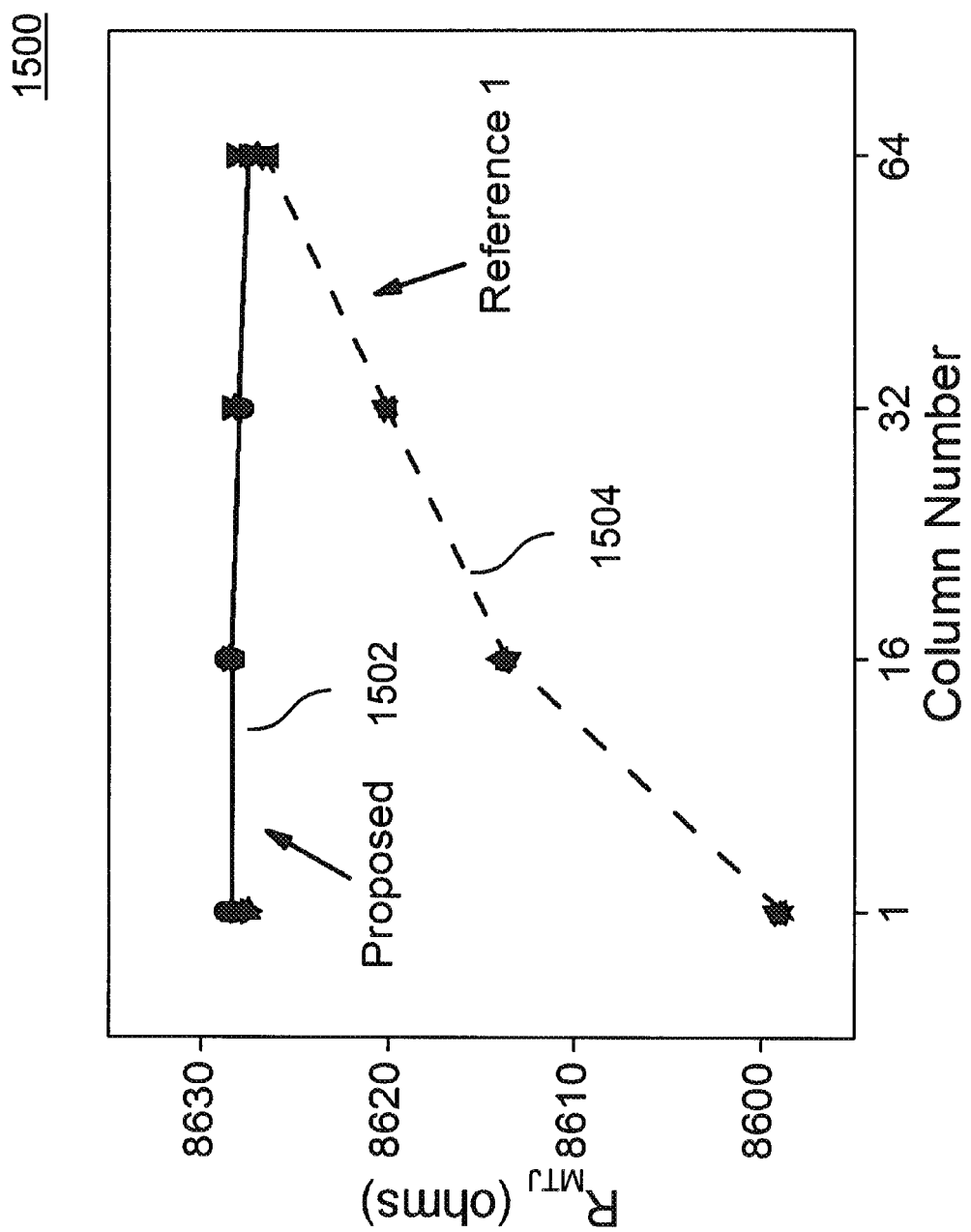
FIG. 15 is a graph showing the calculated resistance of memory cell according to various embodiments, Rmtj (ohms), against the column number.

FIG. 15 is a graph 1500 showing the calculated resistance of memory cell according to various embodiments, Rmtj (ohms), against the column number. As shown in FIG. 15, the calculated resistance is relatively invariant over the different column number (line 1502), indicating column location independency in addition to driver location independency.

Measured first potential difference across memory cell, selection component, column switch, parasitic resistance of the common bit line and common source line across the first current path and parasitic resistance of the main bit line across first current path may be provided by:

$$V_{BS}=I_{char}[(n+m+1)R_0+R_{MTJ}+R_{ST}+R_{CS}+R_{PM}] \quad (7)$$

where $V_{BS}$ is the measured first potential difference, $I_{char}$ is the first current, $R_0$ is the parasitic resistance between neighbouring cells, n is the number of cells in a column, $R_{MTJ}$ is the resistance of the memory element (i.e. MTJ), $R_{ST}$ is the resistance of the selection component (i.e. selection transistor), $R_{CS}$ is the resistance of the column switch and $R_{PM}$ is the parasitic resistance of the main bit line across first current path.

Measured second potential difference across selection component, column switch, parasitic resistance of the common bit line and common source line across the second current path and parasitic resistance of the main bit line across second current path may be provided by:

$$V_{BSD}=I_{char}[(n+m+1)R_0+R_{ST}+R_{CS}+R_{PD}] \quad (8)$$

where $V_{BSD}$ is the measured second potential difference, $I_{char}$ is the second current (substantially equal to the first current), $R_0$ is the parasitic resistance between neighbouring cells, n is the number of cells in a column, $R_{ST}$ is the resistance of the selection component (i.e. selection transistor), $R_{CS}$ is the resistance of the column switch and $R_{PD}$ is the parasitic resistance of the main bit line across second current path.

The measured resistance of the memory element may be provided by $$R_{MTJ}'=(V_{BS}-V_{BSD})/I_{char}=R_{MTJ}+((R_{PD}-R_{PD}) \quad (9)$$

In contrast, the circuit in reference 1 shows a large variation of measured resistance across the different column numbers (line 1504). $R_{PD}$ may be substantially equal to $R_{PD}$ as the first current and the second current go by the same route along the MBL.

Various embodiments eliminate or reduce the mismatch effect caused by the column switches on the paths of the first current and the second current, resulting in a much smaller calculated resistance spread of the memory element. Various embodiments have column location independency. Various embodiments do not introduce column dependence on the calculated MTJ resistance as the two paths go by the same route as the MBL. Various embodiments are generic to different system architectures.

Figure 16A:
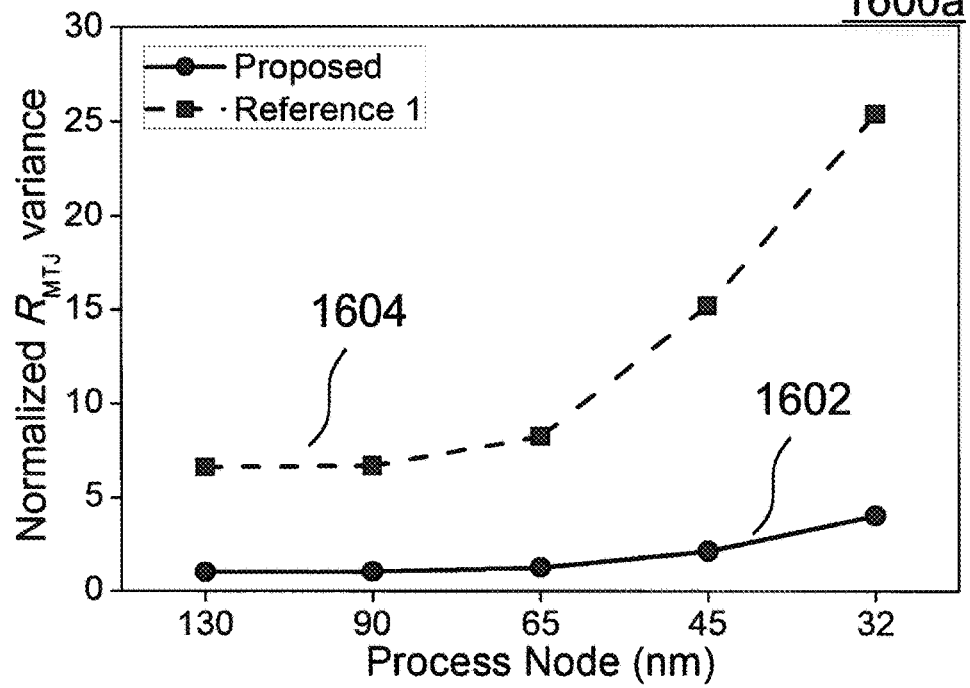
FIG. 16A is a graph showing the normalized standard deviation of the measured resistance (normalized $R_{MTJ}\sigma$) of the memory element against process node.
Figure 16B:
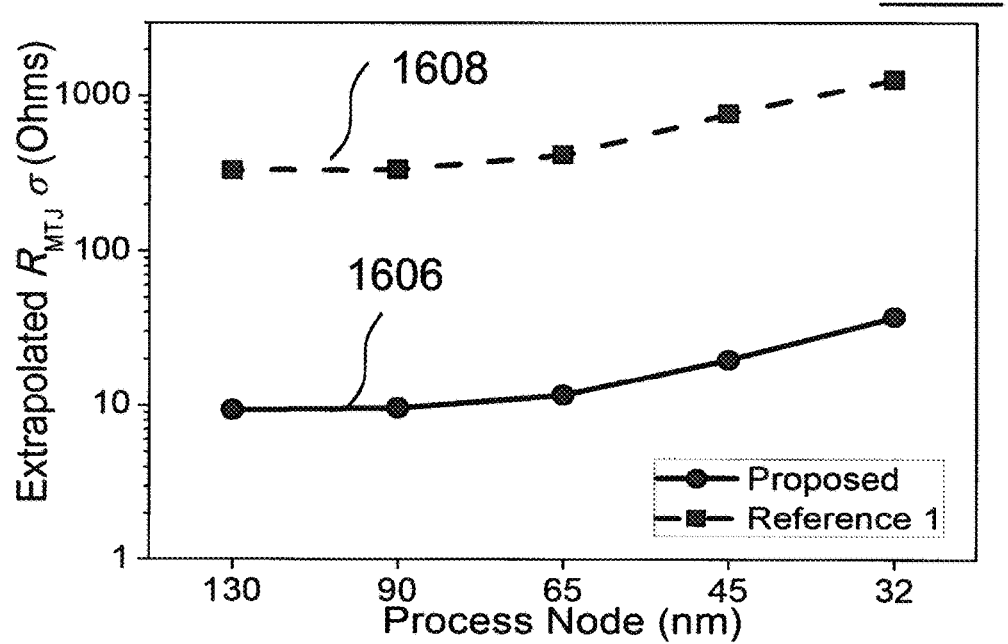
FIG. 16B is a graph showing the simulated standard deviation of the measured resistance (normalized $R_{MTJ}\sigma$) of the memory element against process node.

FIG. 16A is a graph 1600a showing the normalized standard deviation of the measured resistance (normalized $R_{MTJ}$ σ) of the memory element against process node. The normalization is with respect to the 130 nm process node. FIG. 16B is a graph 1600b showing the simulated standard deviation of the measured resistance (normalized $R_{MTJ}$ σ) of the memory element against process node. The simulation is done using Predictive Technology Models (http://ptm.asu.edu/).

The values in FIGS. 16A, 16B are extrapolated based on the real standard deviation σ at the 90 nm physical model. As seen from FIGS. 16A, 16B, the standard deviations of the measured resistance of the circuit arrangement (as indicated by lines 1602, 1606) increase as technology scales down. However, the standard deviations of the measured resistance for the circuit in reference 1 (as indicated in lines 1604, 1608) increase much more drastically. Compared to the circuit in reference 1, the increase in standard deviations of the measured resistance of the circuit arrangement is within an acceptable level.

Further, the method in reference 1 may require adjusting the voltage to produce the same current along the memory line and the dummy line. The method in reference 1 may require at least three iterations on average to reproduce the same current based on binary search algorithm for characterization of the memory element. Various embodiments may only require one try for characterization of the memory element. As such, total characterization time savings may be estimated to be about 66%. While the method in reference 1 has parallel reading capability, the method requires extra current drivers and output pins, which increase chip area and packaging cost. In order to achieve the same characterization time as the claimed subject matter according to various embodiments, the method in reference 1 may need to have three parallel channels (3 drivers and 3 output pins). In order to achieve the same accuracy level as the claimed subject matter according to various embodiments, more columns of replica cells may need to be placed in the memory array so that the replica cell is closer to memory cell to reduce mismatch. Assuming uniform process mismatch, 34 columns of replica cells in the method of reference 1 may be required to match the accuracy of 1 row of dummy cells according to the claimed subject matter at 32 nm process. Using 1 Mb as an unit array (1024×1024) for applying the method, chip overhead may be 3.4% for the method in reference 1 and 0.1% for the claimed subject matter according to various embodiments. FIG. 17 is a table 1700 comparing the figures of merit. Column 1702 shows the figures of merit according to the claimed subject matter while column 1702 shows the corresponding figures of merit for the method or circuit shown in reference 1.

Various embodiments may address issues with conventional methods/circuits for determining resistances in an array. Various embodiments may reduce or eliminate process mismatches among column switches. Various embodiments may take into consideration parasitic effects on the main bit line and/or main source line. Various embodiments may remove the need for several attempts to adjust voltages to reproduce the constant current.

Methods described herein may further contain analogous features of any device or circuit arrangement described herein. Correspondingly, devices or circuit arrangement described herein may further contain analogous features of any methods described herein.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method of determining a resistance of a memory element, the method including:
   applying a first current through the memory element and a first selection component, wherein the memory element and the first selection component are located along a memory line, and measuring a first potential difference across the memory line;
   applying a second current through a second selection component, wherein the second selection component is located along a dummy line, and measuring a second potential difference across the dummy line; and
   determining the resistance of the memory element based on the first potential difference and the second potential difference;
   wherein the first selection component is switched on and the second selection component is switched off during a first time period so that a constant current generated by a current source is the first current applied through the memory element and the first selection component to measure the first potential difference; and
   wherein the first selection component is switched off and the second selection component is switched on during a second time period so that the constant current generated by the current source is the second current applied through the second selection component to measure the second potential difference.

2. The method according to claim 1,
   wherein the first selection component is switched on via a first word line directly coupled to a gate electrode of the first selection component; and
   wherein the second selection component is switched on via a second word line directly coupled to a gate electrode of the second selection component.

3. The method according to claim 1,
   wherein the resistance of the memory element is determined further based on the first current.

4. The method according to claim 1,
   wherein the resistance of the memory element is determined further based on a difference between the first potential difference and the second potential difference.

5. The method according to claim 1,
   wherein an end of the memory line and an end of the dummy line are directly coupled to a common bit line.

6. The method according to claim 5,
   wherein the first potential difference is measured across the memory line and the common bit line; and
   wherein the second potential difference is measured across the dummy line and the common bit line.

7. The method according to claim 6,
   wherein the common bit line comprises a column switch such that the first potential difference is measured across the column switch and the second potential difference is measured across the same column switch.

8. The method according to claim 1,
   wherein an end of the memory line and an end of the dummy line are directly coupled to a common source line.

9. The method according to claim 8,
   wherein the first potential difference is measured across the memory line and the common source line; and
   wherein the second potential difference is measured across the dummy line and the common source line.

10. The method according to claim 9,
wherein the common source line comprises a column switch such that the first potential difference is measured across the column switch and the memory line, and the second potential difference is measured across the same column switch and the dummy line.

11. A circuit arrangement for determining a resistance of a memory element, the circuit arrangement comprising:
the memory element and a first selection component coupled to the memory element along a memory line;
a second selection component along a dummy line;
a current source configured to apply a constant current generated by a current source as a first current to the memory element and the first selection component along the memory line during a first time period, and further configured to apply the constant current generated by the current source as a second current to the second selection component along the dummy line during a second time period; and
a voltage measurement circuit configured to measure a first potential difference across the memory line and further configured to measure a second potential difference across the dummy line for determining the resistance of the memory element; and
a control circuit configured to switch on the first selection component and switch off the second selection component during the first time period to apply the first current through the memory element and the first selection component to measure the first potential difference, and further configured to switch off the first selection component and switch on the second selection component during the second time period to apply the second current through the second selection component to measure the second potential difference.

12. The circuit arrangement according to claim 11, further comprising:
a first word line directly coupled to a control electrode of the first selection component; and
a second word line directly coupled to a control electrode of the second selection component.

13. The circuit arrangement according to claim 11, further comprising:
a common bit line directly coupled to an end of the memory line and an end of the dummy line.

14. The circuit arrangement according to claim 13,
wherein the first potential difference is measured across the memory line and the common bit line; and
wherein the second potential difference is measured across the dummy line and the common bit line.

15. The circuit arrangement according to claim 14,
wherein the common bit line comprises a column switch such that the first potential difference is measured across the column switch and the second potential difference is measured across the same column switch.

16. The circuit arrangement according to claim 11, further comprising:
a common source line directly coupled to an end of the memory line and an end of the dummy line.

17. The circuit arrangement according to claim 16,
wherein the first potential difference is measured across the memory line and the common source line; and
wherein the second potential difference is measured across the dummy line and the common source line.

18. The circuit arrangement according to claim 17, wherein the common source line comprises a column switch such that the first potential difference is measured across the column switch and the memory line, and the second potential difference is measured across the same column switch and the dummy line.

* * * * *